United States Patent
Choi et al.

(10) Patent No.: US 11,837,612 B2
(45) Date of Patent: Dec. 5, 2023

(54) IMAGE SENSOR

(71) Applicant: SAMSUNG ELECTRONICS CO., LTD., Suwon-si (KR)

(72) Inventors: Min-Jun Choi, Hwaseong-si (KR); In Gyu Baek, Seoul (KR); Bom I Sim, Hwaseong-si (KR); Jin Yong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 17/239,093

(22) Filed: Apr. 23, 2021

(65) Prior Publication Data

US 2022/0052086 A1 Feb. 17, 2022

(30) Foreign Application Priority Data

Aug. 13, 2020 (KR) .......................... 10-2020-0101634

(51) Int. Cl.
*H01L 27/146* (2006.01)
*H01L 49/02* (2006.01)

(52) U.S. Cl.
CPC .. *H01L 27/14603* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14683* (2013.01); *H01L 28/91* (2013.01)

(58) Field of Classification Search
CPC ............................................... H01L 28/90–92
See application file for complete search history.

(56) References Cited

U.S. PATENT DOCUMENTS

| | | | |
|---|---|---|---|
| 9,159,763 B2 | 10/2015 | Takahashi | |
| 10,163,946 B2 | 12/2018 | Kwon | |
| 10,497,739 B2 | 12/2019 | Takase et al. | |
| 10,720,465 B2 * | 7/2020 | Matsumoto | ....... H01L 27/14687 |
| 2012/0306057 A1 * | 12/2012 | Kim | .................. H10B 12/0335 |
| | | | 257/E29.112 |

(Continued)

FOREIGN PATENT DOCUMENTS

| | | |
|---|---|---|
| KR | 1999-028654 A1 | 4/1999 |
| KR | 2001-0007410 A | 1/2001 |

(Continued)

*Primary Examiner* — Evren Seven
*Assistant Examiner* — Cole Leon Lindsey
(74) *Attorney, Agent, or Firm* — Sughrue Mion, PLLC

(57) ABSTRACT

An image sensor includes: a substrate including a first surface and a second surface on which light is incident, the second surface being opposite to the first surface; a photoelectric converter provided in the substrate; a first metal layer provided on the first surface of the substrate; a second metal layer provided on the first metal layer; and a capacitor layer provided between the first metal layer and the second metal layer, wherein the capacitor layer includes: a first lower electrode electrically connected to the first metal layer, a first upper electrode electrically connected to the second metal layer, a second upper electrode spaced apart from the first upper electrode and electrically connected to the second metal layer, a first capacitor provided between the first lower electrode and the first upper electrode, and a second capacitor provided between the first lower electrode and the second upper electrode.

20 Claims, 25 Drawing Sheets

(56) References Cited

U.S. PATENT DOCUMENTS

| | | | |
|---|---|---|---|
| 2019/0123088 A1* | 4/2019 | Kwon | ............... H01L 27/14634 |
| 2020/0058688 A1 | 2/2020 | Kwon et al. | |
| 2020/0105810 A1 | 4/2020 | Moon et al. | |
| 2020/0127029 A1 | 4/2020 | Meynants | |
| 2020/0127034 A1 | 4/2020 | Zhang et al. | |

FOREIGN PATENT DOCUMENTS

| KR | 2002-0002339 A | 1/2002 |
|---|---|---|
| KR | 10-2004-0110550 A | 12/2004 |
| KR | 10-2009-0033184 A | 4/2009 |
| KR | 10-1029389 B1 | 5/2011 |
| KR | 10-1614416 B1 | 4/2016 |
| KR | 10-2017-0028821 A | 3/2017 |
| KR | 10-2017-0134578 A | 12/2017 |
| KR | 10-1867203 B1 | 6/2018 |
| KR | 10-2019-0116979 A | 10/2019 |

* cited by examiner

IMAGE SENSOR

CROSS-REFERENCE TO RELATED APPLICATION

This application claims priority from Korean Patent Application No. 10-2020-0101634 filed on Aug. 13, 2020 in the Korean Intellectual Property Office, the disclosure of which is incorporated by reference herein in its entirety.

BACKGROUND

1. Field

Example embodiments of the disclosure relate to an image sensor.

2. Description of Related Art

An image sensing device is one of semiconductor elements that convert optical information into an electric signal. Such an image sensing device may include a charge coupled device (CCD) image sensing device and a complementary metal-oxide semiconductor (CMOS) image sensing device.

The CMOS image sensor (CIS) may include a plurality of pixels arranged in two dimensions. Each of the pixels may include, for example, a photo diode (PD). The photo diode may serve to convert incident light into electrical signals.

Recently, with development of the computer industry and the telecommunications industry, demands for image sensors with improved performance have increased in various fields such as a digital camera, a video camera, a smartphone, a game console, a security camera, a medical micro camera, and a robot.

SUMMARY

One or more example embodiments of the disclosure provide an image sensor that ensures a stable process.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of an example embodiment, there is provided an image sensor including: a substrate including a first surface and a second surface on which light is incident, the second surface being opposite to the first surface; a photoelectric converter provided in the substrate; a first metal layer provided on the first surface of the substrate; a second metal layer provided on the first metal layer; and a capacitor layer provided between the first metal layer and the second metal layer, wherein the capacitor layer includes: a first lower electrode electrically connected to the first metal layer, a first upper electrode electrically connected to the second metal layer, a second upper electrode spaced apart from the first upper electrode and electrically connected to the second metal layer, a first capacitor provided between the first lower electrode and the first upper electrode, and a second capacitor provided between the first lower electrode and the second upper electrode.

According to an aspect of an example embodiment, there is provided an image sensor including: a first layer; a photoelectric converter in the first layer; a first transistor provided in the first layer and adjacent to the photoelectric converter; a second transistor provided in the first layer and electrically connected to the first transistor; a second layer provided on the first layer and including a first surface facing the first layer and a second surface opposite to the first surface; a first lower wiring electrically connected to the first transistor, the first lower wiring being provided on the first surface; a second lower wiring electrically connected to the second transistor, the second lower wiring being provided on the first surface; a first upper wiring provided on the second surface; a second upper wiring provided on the second surface; a capacitor structure electrically connected to the first upper wiring and the first lower wiring, the capacitor structure including a first capacitor; and a connector electrically connected to the second upper wiring and the second lower wiring, the connector including a second capacitor.

According to an aspect of an example embodiment, there is provided an image sensor including: a first layer including a first surface and a second surface on which light is incident, the second surface being opposite to the first surface; a photoelectric converter provide in the first layer; a first transistor provided in the first layer and adjacent to the photoelectric converter; a second transistor provided in the first layer and electrically connected to the first transistor; a second layer provided on the first surface, the second layer including a third surface facing the first surface and a fourth surface opposite to the third surface; a first lower wiring electrically connected to the first transistor, the first lower wiring being disposed on the third surface; a second lower wiring electrically connected to the second transistor, the second lower wiring being provided on the third surface; a first upper wiring, a second upper wiring, and a third upper wiring that are provided on the fourth surface; a first lower electrode electrically connected to the first lower wiring; a second lower electrode electrically connected to the second lower wiring; a first upper electrode electrically connected to the first upper wiring through a first contact plug; a second upper electrode electrically connected to the second upper wiring through a second contact plug; a third upper electrode electrically connected to the third upper wiring through a third contact plug; a first capacitor provided between the first lower electrode and the first upper electrode; a second capacitor provided between the first lower electrode and the second upper electrode; and a third capacitor provided between the second lower electrode and the third upper electrode.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Hereinafter, example embodiments according to the disclosure will be explained referring to the accompanying drawings.

Figure 1:
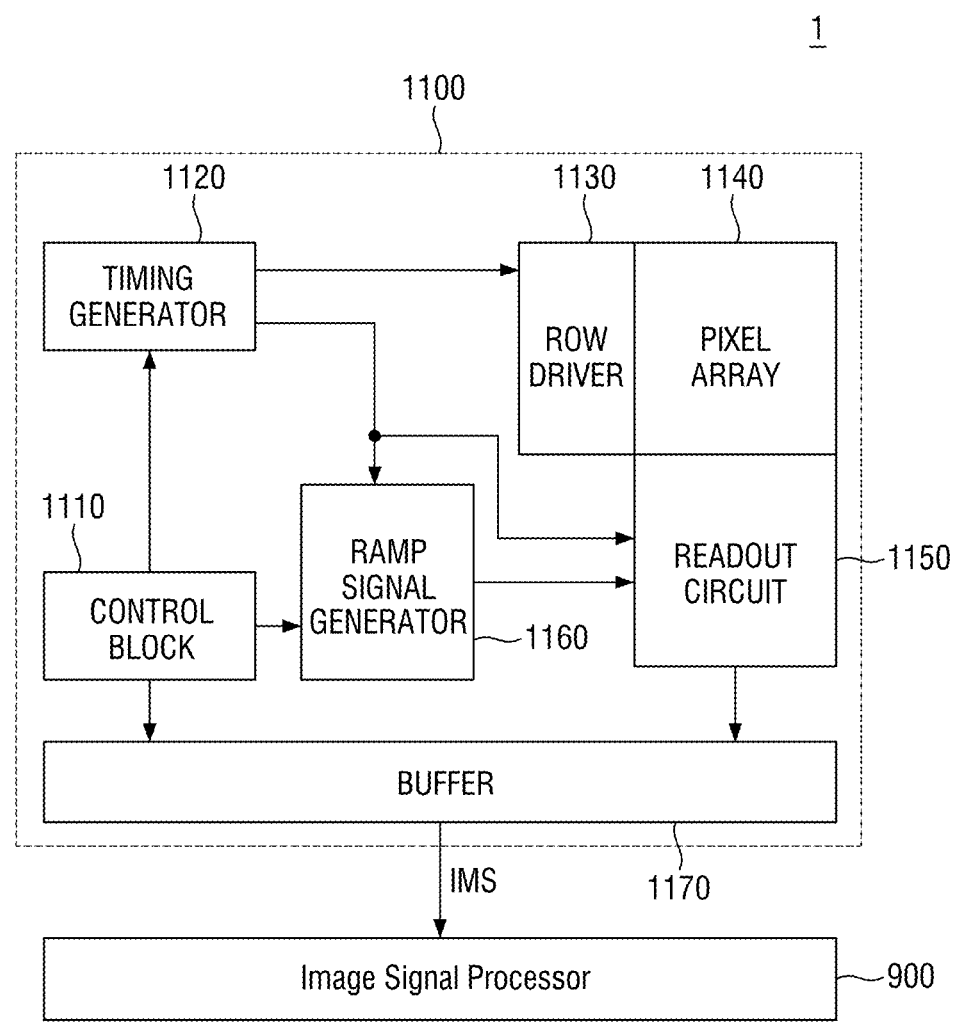
FIG. 1 is a block diagram of an image sensing device according to some example embodiments.

FIG. 1 is a block diagram of an image sensing device according to some example embodiments.

Referring to FIG. 1, an image sensing device 1 may include an image sensor 1100 and an image processor 900.

The image sensor 1100 may sense a target image using light to generate an image signal IMS. In some example embodiments, the generated image signal IMS may be, for example, a digital signal. However, embodiments according to the disclosure are not limited thereto.

The image signal IMS may be provided to the image processor 900 and processed by the image processor 900. The image processor 900 may receive the image signal IMS that is output from a buffer 1170 of the image sensor 1100, and process or treat the received image signal IMS.

In some example embodiments, the image processor 900 may perform digital binning on the image signal IMS that is output from the image sensor 1100. At this time, the image signal IMS that is output from the image sensor 1100 may be a raw image signal from a pixel array 1140 without analog binning, or may be an image signal IMS in which the analog binning has already been performed.

In some example embodiments, the image sensor 1100 and the image processor 900 may be provided separately from each other, as shown. For example, the image sensor 1100 is mounted on a first chip, the image processor 900 is mounted on a second chip, and the image sensor 1100 and the image processor 900 may communicate with each other through a predetermined interface. However, the embodiments are not limited thereto, and the image sensor 1100 and the image processor 900 may be implemented as a single package, for example, a multi-chip package (MCP).

The image sensor 1100 may include a control register block 1110, a timing generator 1120, a row driver 1130, a pixel array 1140, a readout circuit 1150, a ramp signal generator 1160, and a buffer 1170.

The control register block 1110 may generally control the operation of the image sensor 1100. In particular, the control register block 1110 may directly transmit an operation signal to the timing generator 1120, the ramp signal generator 1160 and the buffer 1170.

The timing generator 1120 may generate a signal (e.g., an operation timing reference signal) that serves as a reference for an operation timing of various components of the image sensor 1100. The operation timing reference signal generated by the timing generator 1120 may be transmitted to the row driver 1130, the readout circuit 1150, and the ramp signal generator 1160.

The ramp signal generator 1160 may generate and transmit a ramp signal used in the readout circuit 1150. For example, the readout circuit 1150 may include a correlated double sampler (CDS), a comparator, and the like, and the ramp signal generator 1160 may generate and transmit the ramp signal used in the correlated double sampler (CDS), the comparator, and the like.

The buffer 1170 may include, for example, a latch. The buffer 1170 may temporarily store the image signal IMS to be provided to the outside, and may transfer the image signal IMS to an external memory or an external device.

The pixel array 1140 may sense external images. The pixel array 1140 may include a plurality of pixels (or unit pixels). The row driver 1130 may selectively activate a row of the pixel array 1140.

The readout circuit 1150 samples the pixel signal provided from the pixel array 1140, compares the sampled pixel signal with the ramp signal, and then may convert the analog image signal (data) into a digital image signal (data) based on comparison results.

Figure 2:
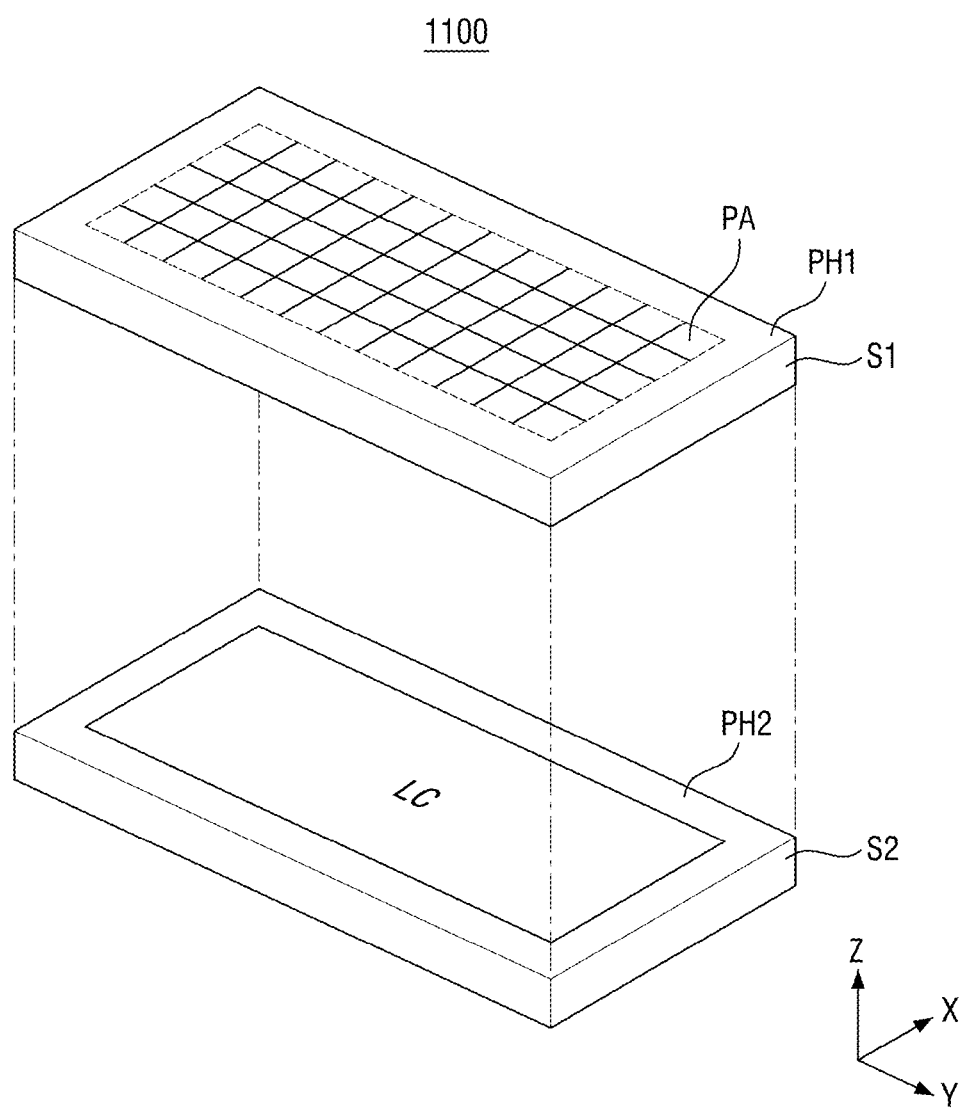
FIG. 2 is a diagram showing a conceptual layout of the image sensor of FIG. 1.

FIG. 2 is a diagram showing a conceptual layout of the image sensor of FIG. 1.

Referring to FIG. 2, the image sensor 1100 may include a first region S1 and a second region S2 stacked in a third direction Z (e.g., a vertical direction). The first region S1 and the second region S2 may respectively extend in a first direction X and a second direction Y, as shown, and blocks shown in FIG. 1 may be placed in the first region S1 and the second region S2.

Although not shown in the drawings, a third region in which a memory is placed may be provided on or below the second region S2. In this case, the memory placed in the third region may receive image data from the first region S1 and the second region S2, store and/or process the image data, and may transfer the image data to the first region S1 and the second region S2 again. The memory may include a memory element such as a dynamic random access memory (DRAM) element, a static random access memory (SRAM) element, a spin transfer torque magnetic random access memory (STT-MRAM) element, and a flash memory element. When the memory includes, for example, the DRAM element, the memory may receive and process the image data at a relatively high speed. Also, in some example embodiments, the memory may be placed in the second region S2.

The first region S1 may include a pixel array region PA and a first peripheral region PH1, and the second region S2 may include a logic circuit region LC and a second peripheral region PH2. The first region S1 and the second region S2 may be sequentially and vertically stacked.

In the first region S1, the pixel array region PA may be a region in which the pixel array (e.g., the pixel array 1140 of FIG. 1) is placed. The pixel array region PA may include a plurality of unit pixels placed in a matrix form. Each pixel may include photo diodes and transistors. A more specific description thereof will be provided later.

The first peripheral region PH1 may include a plurality of pads, and may be placed around the pixel array region PA. The plurality of pads may transmit and receive electrical signals from an external device or the like.

In the second region S2, the logic circuit region LC may include electronic elements including a plurality of transistors. Electronic elements included in the logic circuit region LC may be electrically connected to the pixel array region PA to provide a signal to each unit pixel PX of the pixel array region PA or control an output signal of the pixel array region PA.

For example, the control register block 1110, the timing generator 1120, the row driver 1130, the readout circuit 1150, the ramp signal generator 1160, the buffer 1170, and the like explained referring to FIG. 1 may be placed in the logic circuit region LC. For example, blocks other than the pixel array 1140 among the blocks of FIG. 1 may be placed in the logic circuit region LC.

The second peripheral region PH2 may be placed in a region of the second region S2 corresponding to the first peripheral region PH1 of the first region S1. However, the embodiments are not limited thereto.

Figure 3:
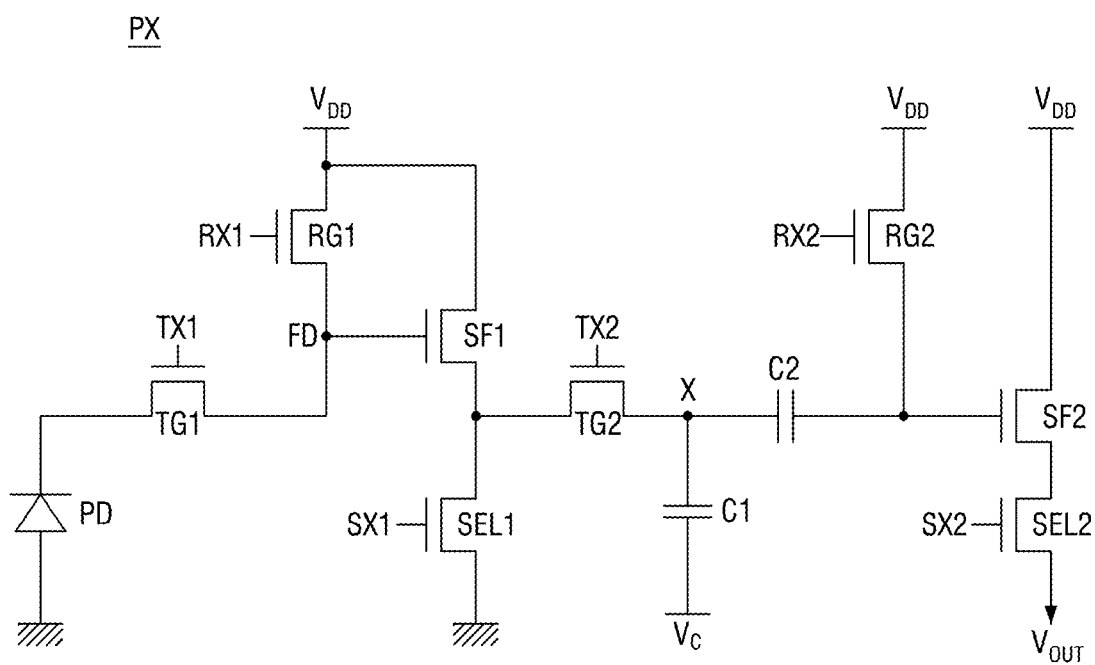
FIG. 3 is an example circuit diagram of a pixel of an image sensor according to some example embodiments.

FIG. 3 is an example circuit diagram of a pixel of an image sensor according to some example embodiments.

Referring to FIG. 3, a pixel PX of the image sensor 1100 according to some example embodiments may include a photoelectric conversion element (or a photoelectric converter) PD, a first transfer transistor TG1, a floating diffusion region FD, a first reset transistor RG1, a first source follower transistor SF1, a first selection transistor SEL1, a second transfer transistor TG2, a first capacitor C1, a second capacitor C2, a second reset transistor RG2, a second source follower transistor SF2 and a second selection transistor SEL2.

The photoelectric conversion element PD may absorb light and accumulate an electric charge corresponding to an amount of the absorbed light. The photoelectric conversion element PD may include, for example, a photo diode, a photo transistor, a photo gate, a pinned photo diode, an organic photo diode, quantum dot, and one or more combinations thereof.

The photoelectric conversion element PD may be coupled with the first transfer transistor TG1 that transfers the accumulated charge to the floating diffusion region FD. Since the floating diffusion region FD is a region at which the electric charge is converted into a voltage and has a parasitic capacitance, the electric charge may be accumulatively stored therein.

A first end of the first transfer transistor TG1 may be connected to the photoelectric conversion element PD, and a second end of the first transfer transistor TG1 may be connected to the floating diffusion region FD. The first transfer transistor TG1 may be a metal-oxide-silicon (MOS) transistor driven by a predetermined bias (e.g., first transfer signal TX1). The first transfer transistor TG1 may transfer an optical signal, which is a charge generated from the photoelectric conversion element PD, to the floating diffusion region FD according to the first transfer signal TX1.

The first reset transistor RG1 may periodically reset the floating diffusion region FD. The first reset transistor RG1 may be a MOS transistor driven by a reset line that applies a predetermined bias (e.g., a first reset signal RX1). When the first reset transistor RG1 is turned on by the first reset signal RX1, a predetermined electrical potential provided to a drain of the first reset transistor RG1, for example, a power supply voltage VDD may be transmitted to the floating diffusion region FD.

The first source follower transistor SF1 amplifies a change in electrical potential of the floating diffusion region FD to which the charge stored in the photoelectric conversion element PD is transmitted, and may output the amplified change in electrical potential to the second transfer transistor TG2. When the first source follower transistor SF1 is turned on, a predetermined electrical potential provided to the drain of the first source follower transistor SF1, for example, the power supply voltage VDD may be transmitted to a first end of the second transfer transistor TG2.

The first selection transistor SEL1 may allow the first source follower transistor SF1 to be turned on or off. The first selection transistor SEL1 may be a MOS transistor that is driven by a selection line that applies a predetermined bias (e.g., a first selection signal SX1).

The first end of the second transfer transistor TG2 may be connected to a first end of the first source follower transistor SF1, and a second end of the second transfer transistor TG2 may be connected to a node X. The second transfer transistor TG2 may be a MOS transistor that is driven by a predetermined bias (e.g., a second transfer signal TX2). The second transfer transistor TG2 may transfer the signal amplified by the first source follower transistor SF1 to the node X according to the second transfer signal TX2.

A first end of the first capacitor C1 and a first end of the second capacitor C2 may be connected at the node X. The first capacitor C1 and the second capacitor C2 may store the charge received from the second transfer transistor TG2. A second end of the first capacitor C1 may be connected to an external voltage Vc.

An electric shutter type of an image sensor includes a rolling shutter type and a global shutter type. The rolling shutter type is a type of controlling a charge accumulation time differently for each row of the pixel array, and the global shutter type is a type of controlling the charge accumulation time to be equal for all the rows of the pixel array.

Because time periods in which all the pixels PX included in the pixel array (e.g., 1140 of FIG. 1) are exposed to light are the same, the global shutter may remove an image distortion even in moving images, unlike the rolling shutter. Therefore, each pixel PX may store charge accumulated by the optical sensing element included in the pixel PX, after the time period in which the pixel PX is exposed to light ends and until the output voltage VOUT output by the pixel PX is measured.

In some example embodiments, in order to support the global shutter, the pixel PX may include the first capacitor C1 and the second capacitor C2 that temporarily store the charge accumulated by the photoelectric conversion element PD.

A first end of the second reset transistor RG2 may be connected to the power supply voltage VDD, and a second end of the second reset transistor RG2 may be connected to a second end of the second capacitor C2. The second reset transistor RG2 may be gated by a second reset control signal RX2. The second reset transistor RG2 may reset the first capacitor C1 or the second capacitor C2 with the power supply voltage VDD.

A first end of the second source follower transistor SF2 may be connected to the power supply voltage VDD, and a second end of the second source follower transistor SF2 may be connected to a first end of the second selection transistor SEL2. The second source follower transistor SF2 may be a drive transistor that may generate an output voltage VOUT based on the charge stored in the first capacitor C1 or the second capacitor C2. The second source follower transistor SF2 acts as a source follower buffer amplifier in combination with a constant current source located outside the pixel PX, and may amplify the potential change in the first capacitor C1 or the second capacitor C2 to generate the output voltage VOUT. The output voltage VOUT may be output to the second selection transistor SEL2.

The first end of the second selection transistor SEL2 may be connected to the second end of the second source follower transistor SF2, and a second end of the second selection transistor SEL2 may be connected to a column line. The second selection transistor SEL2 may be gated by a second selection signal SX2. The second selection transistor SEL2 may output the output voltage VOUT to the column line connected to the pixel array 1140.

In some example embodiments, the first transfer signal TX1, the first selection signal SX1, the first reset signal RX1, the second transfer signal TX2, the second selection signal SX2 and the second reset signal RX2 may be output from the row driver 1130 of FIG. 1.

Hereinafter, pixels PX and PX1 included in the image sensor 1100 according to some example embodiments will be explained referring to FIGS. 4 to 7.

Figure 4:
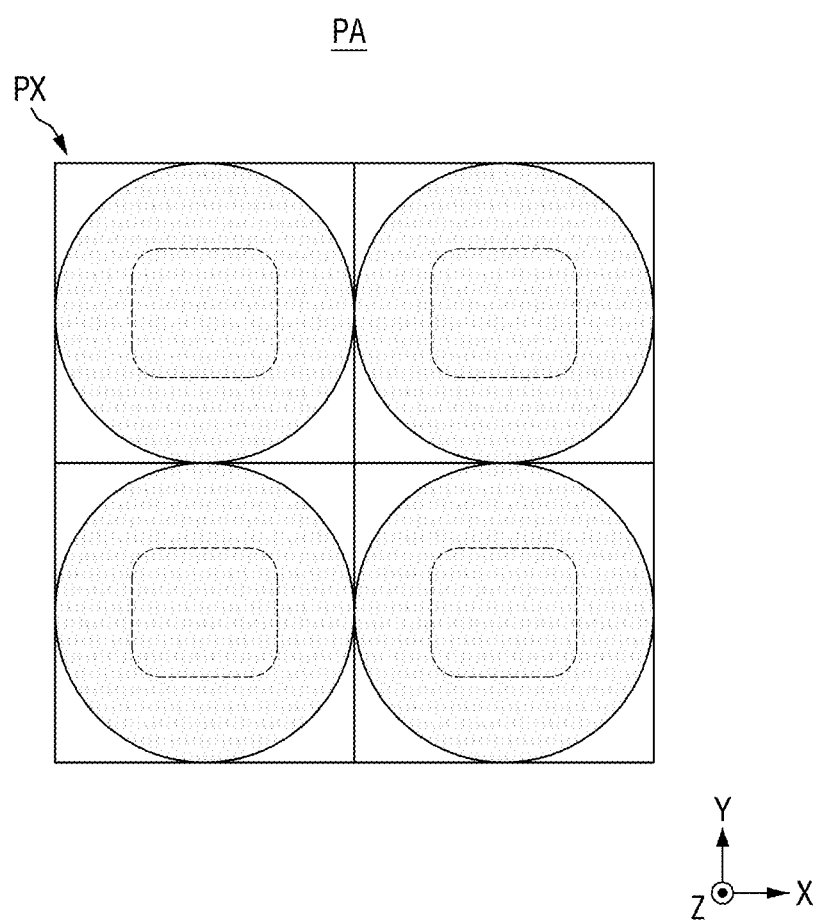
FIG. 4 is a diagram showing a pixel array region of an image sensor according to some example embodiments.
Figure 5:
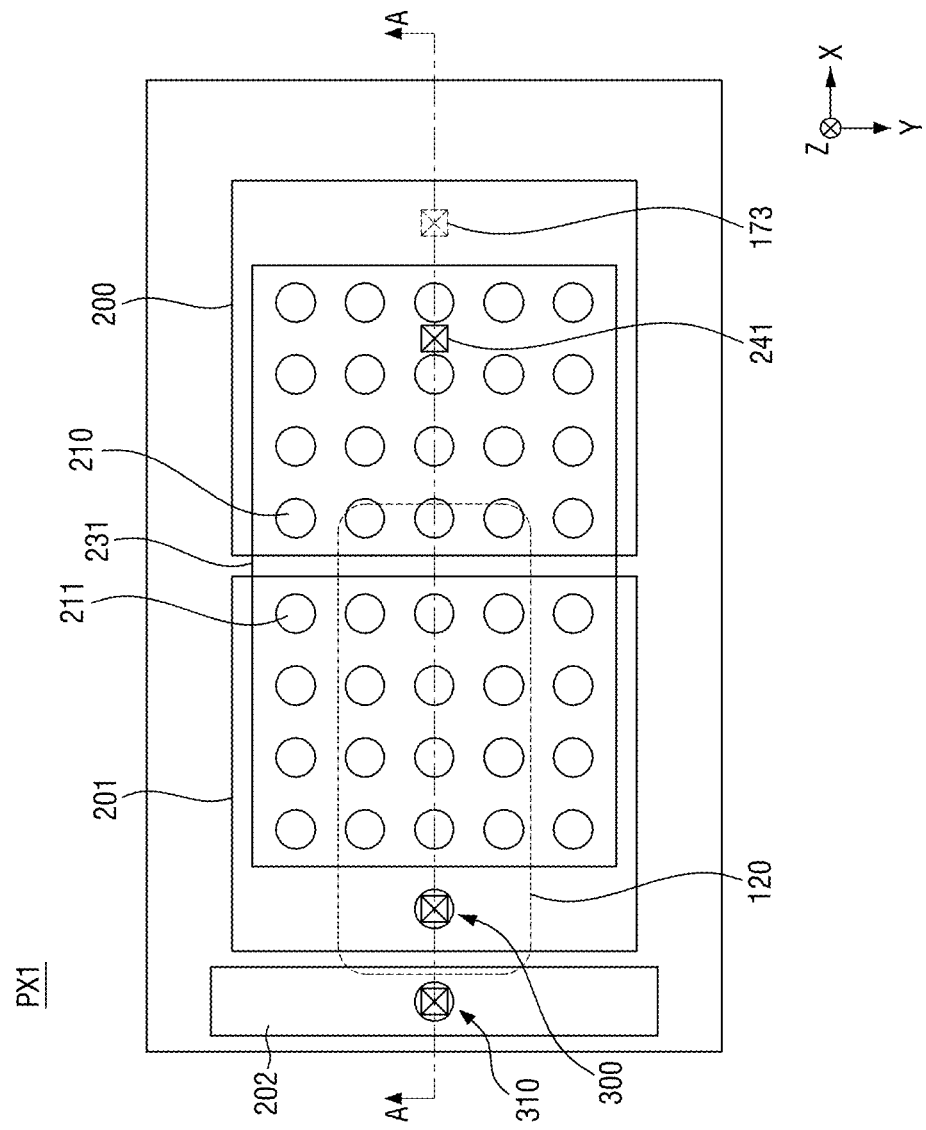
FIG. 5 is a diagram showing a layout of a pixel according to some example embodiments.
Figure 6:
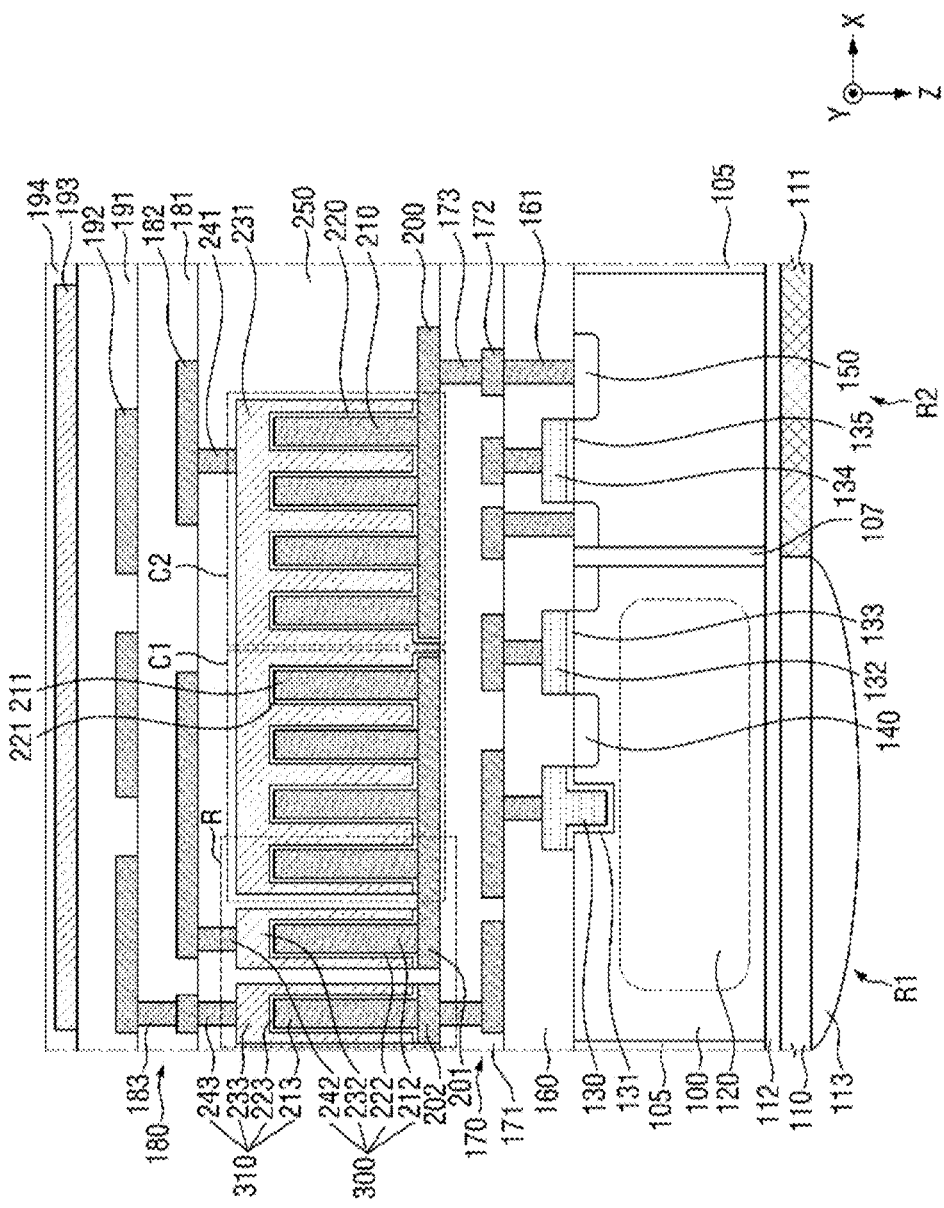
FIG. 6 is a cro0073s-sectional view of the pixel taken along A-A of FIG. 5.
Figure 7:
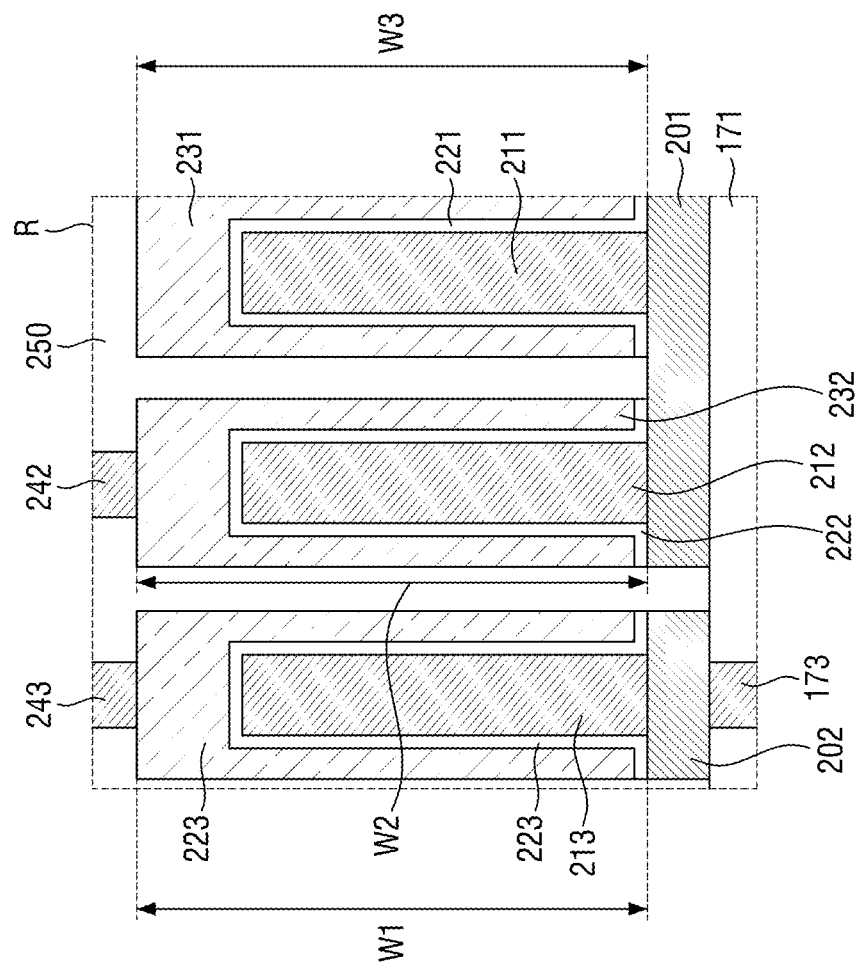
FIG. 7 is an enlarged view of a region R of FIG. 6.

FIG. 4 is a diagram showing a pixel array region of an image sensor according to some example embodiments. FIG. 5 is a diagram showing a layout of a pixel according to some example embodiments. FIG. 6 is a cross-sectional view of the pixel taken along A-A of FIG. 5. FIG. 7 is an enlarged view of a region R of FIG. 6.

Referring to FIG. 4, the pixel array region PA may include plurality of pixels PX. For example, FIG. 4 shows that the pixel array region PA includes four pixels PX, for purpose of illustration only. Here, the pixel array region PA may be included in the image sensor 1100. For example, the pixel array region PA may be the pixel array region PA of FIG. 2 and may include the pixel array 1140 of FIG. 1. Further, the pixel PX may be a unit pixel included in the pixel array region PA. For example, a plurality of pixels PX may be placed along the first direction X and the second direction Y at regular intervals. However, the embodiment according to the disclosure not limited thereto.

Referring to FIG. 5, the pixel PX1 may be a layout of the pixel PX1 corresponding to the pixel PX of FIG. 4 when the pixel PX is viewed in the third direction Z. That is, FIG. 5 may be a layout in which the pixel PX is viewed from below the pixel PX.

Referring to FIGS. 5 and 6, the pixel PX1 may include a substrate 100. The substrate 100 may include a silicon substrate. The substrate 100 may extend along the first direction X and the second direction Y.

The substrate 100 may be surrounded by an element isolation film 105. For example, the element isolation film 105 may be placed along the periphery of the substrate 100. That is, the element isolation film 105 may separate the pixels PX1 from each other. For example, the element isolation film 105 may include an insulating material having a lower refractive index than that of the substrate 100. For example, when the substrate 100 includes silicon, the element isolation film 105 may include a silicon oxide film, a silicon nitride film, an undoped polysilicon layer, air or a combination thereof.

The substrate 100 may be separated into a first region R1 and a second region R2 by an element isolation film 107. The element isolation film 107 may be placed apart from the element isolation film 105. The first region R1 may be a region that receives light, and the second region R2 may be a region in which a circuit is placed. For example, the element isolation film 107 may include a silicon oxide film, a silicon nitride film, an undoped polysilicon layer, air or a combination thereof.

The substrate 100 may be doped with a first conductive type dopant. For example, the first conductive type may be a P type, but the embodiment according to the disclosure is not limited thereto.

A first dopant injection region 120 may be placed inside the substrate 100. The first dopant injection region 120 may be doped with, for example, a second conductive type dopant opposite to the first conductive type. For example, when the first conductive type is a P type, the second conductive type may be an N type. The first dopant injection region 120 may be doped with the N-type dopant accordingly.

The first dopant injection region 120 and the substrate 100 form a PN junction, and a photoelectric conversion element PD may be formed accordingly. That is, the first dopant injection region 120 and the substrate 100 may be the photoelectric conversion element PD in the circuit of FIG. 3.

In some example embodiments, a gate electrode 130, a gate electrode 132 and a gate electrode 134 may be placed on the substrate 100. For example, the gate electrode 130 and the gate electrode 132 may be placed on the first region R1 of the substrate 100, and the gate electrode 134 may be placed on the second region R2 of the substrate 100. The gate electrodes 130, 132 and 134 may include at least one of dopant-doped polysilicon, metal silicide such as cobalt silicide, a metal nitride film such as a titanium nitride film, and a metal film such as tungsten, copper and aluminum.

A gate insulating film 131 may be placed between the gate electrode 130 and the substrate 100. A gate insulating film 133 may be placed between the gate electrode 132 and the substrate 100. A gate insulating film 135 may be placed between the gate electrode 134 and the substrate 100. The gate insulating films 131, 133 and 135 may include at least one of a silicon oxide film, a silicon nitride film, a metal oxide film, or a metal nitride film.

A part of the gate electrode 130 placed in the first region R1 may extend into the substrate 100. For example, the gate electrode 130 may be adjacent to the first dopant injection region 120 inside the substrate 100.

A second dopant injection region 140 may be placed between the gate electrode 130 and the gate electrode 132. For example, the second dopant injection region 140 may be placed inside the substrate 100 between the gate electrode 130 and the gate electrode 132. Further, a third dopant injection region 150 may be placed on both sides of the gate electrode 134.

The second dopant injection region 140 and the third dopant injection region 150 may include the second conductive type dopant. That is, the second dopant injection region 140 and the third dopant injection region 150 may be doped with the second conductive type dopant. For example, when the first conductive type is a P type and the second conductive type is an N type, the dopant doped in the second dopant injection region 140 and the third dopant injection region 150 are may be an N-type.

The second dopant injection region 140 may be a floating diffusion region. For example, the second dopant injection region 140 may be the floating diffusion region FD of the circuit of FIG. 3.

The gate electrode 130, the gate electrode 132 and the gate electrode 134 may be included in at least one transistor in the circuit of FIG. 3. For example, the gate electrode 130 may be a gate of the first transfer transistor TG1. For example, the gate electrode 132 may be a gate of the first reset transistor RG1. For example, the gate electrode 134 may be a gate of the second reset transistor RG2.

Further, at least one transistor of the first transfer transistor TG1, the first reset transistor RG1, the first source follower transistor SF1, the first selection transistor SEL1, the second transfer transistor TG2, the second reset transistor RG2, the second source follower transistor SF2 and the second selection transistor SEL2 may be placed on the substrate 100. However, the embodiment according to the disclosure is not limited thereto.

A first interlayer insulating film 160 may cover a surface of the substrate 100. For example, the first interlayer insulating film 160 may cover the gate electrodes 130, 132 and 134 placed on the substrate 100. Further, the first interlayer insulating film 160 may cover the second dopant injection region 140 and the third dopant injection region 150 placed on the substrate 100. For example, the first interlayer insulating film 160 may include an insulating material.

A first contact plug 161 may be formed in the first interlayer insulating film 160. For example, the first contact plug 161 may extend from the gate electrodes 130, 132 and 134, the second dopant injection region 140 and the third dopant injection region 150. That is, the first contact plug 161 may be formed to penetrate the first interlayer insulating film 160. The first contact plug 161 may include, for example, a metal such as tungsten, copper and aluminum.

A first metal layer 170 may be formed on the first interlayer insulating film 160. The first metal layer 170 may include a second interlayer insulating film 171, a first wiring 172, and a second contact plug 173.

The second interlayer insulating film 171 may cover the first interlayer insulating film 160, and the first contact plug 161. The second interlayer insulating film 171 may include, for example, an insulating material.

The first wiring 172 may be placed inside the first metal layer 170. For example, the first wiring 172 may be surrounded by the second interlayer insulating film 171. The first wiring 172 is placed at a lower portion of the first metal layer 170 and may be electrically connected to the first contact plug 161. The first wiring 172 may include, for example, a metal such as tungsten, copper, and aluminum.

The second contact plug 173 may be placed inside the first metal layer 170. The second contact plug 173 may extend to penetrate the second interlayer insulating film 171. The second contact plug 173 may be electrically connected to the first wiring 172. The second contact plug 173 may include a metal such as tungsten, copper and aluminum.

A lower electrode 200, a lower electrode 201 and a lower electrode 202 may be formed on the first metal layer 170. The lower electrode 200, the lower electrode 201 and the lower electrode 202 may be a plain plate extending along the first direction X and the second direction Y when viewed from above (for example, the third direction Z). The lower electrode 200, the lower electrode 201 and the lower electrode 202 may include a metal such as tungsten, copper, aluminum, titanium, and tantalum.

The lower electrode 200, the lower electrode 201 and the lower electrode 202 may be spaced apart from each other. For example, referring to FIG. 5, the lower electrode 200, the lower electrode 201 and the lower electrode 202 may be spaced apart from each other in the first direction X. The lower electrode 200, the lower electrode 201 and the lower electrode 202 may be electrically connected to the second contact plug 173 included in the first metal layer 170.

Referring to FIG. 6 again, a conductive filler 210 may be placed on the lower electrode 200. There may be a plurality of conductive fillers 210. For example, the plurality of conductive fillers 210 may be spaced apart from each other along the first direction X and the second direction Y. For example, the conductive filler 210 may have a columnar shape extending in the third direction Z.

The conductive filler 211 may be placed on the lower electrode 201. There may be plurality of conductive fillers 211. For example, the plurality of conductive fillers 211 may be spaced apart from each other along the first direction X and the second direction Y. For example, the conductive filler 211 may be a columnar shape extending in the third direction Z.

The conductive filler 210 may be electrically connected to the lower electrode 200, and the conductive filler 211 may be electrically connected to the lower electrode 201. The conductive fillers 210 and 211 may include dopant-doped polysilicon or a metal such as tungsten, copper, aluminum, titanium, and tantalum.

A dielectric film 220 may cover side walls and an upper surface of the conductive filler 210, and may cover an upper surface of the lower electrode 200 on which the conductive filler 210 is not placed. Further, the dielectric film 221 may cover side walls and an upper surface of the conductive filler 211, and may cover an upper surface of the lower electrode 201 on which the conductive filler 211 is not placed. The dielectric films 220 and 221 may be, for example, a single film or a multi-film structure of at least one oxide film of silicon, tungsten, copper, aluminum, titanium, tantalum, zirconium, and lanthanum.

An upper electrode 231 may cover the dielectric film 220 and the dielectric film 221. The upper electrode 231 may be spaced apart from the lower electrodes 200 and 201 by the dielectric film 220 and the dielectric film 221. The upper electrode 231 may not cover a part of the lower electrodes 200 and 201. For example, the upper electrode 231 may include dopant-doped polysilicon or a metal such as tungsten, copper, aluminum, titanium, and tantalum.

A part of the lower electrode 201, the conductive filler 211, the dielectric film 221 and the upper electrode 231 may form a first capacitor C1. For example, a part of the lower electrode 201, the conductive filler 211, the dielectric film 221 and the upper electrode 231 may be the first capacitor C1 of FIG. 3.

A part of the lower electrode 200, the conductive filler 210, the dielectric film 220 and the upper electrode 231 may form a second capacitor C2. For example, a part of the lower electrode 200, the conductive filler 210, the dielectric film 220 and the upper electrode 231 may be the second capacitor C2 of FIG. 3.

The first capacitor C1 and the second capacitor C2 may share the upper electrode 231. That is, the first capacitor C1 and the second capacitor C2 may be electrically connected to each other through the upper electrode 231.

A third contact plug 241 may be formed on the upper electrode 231. For example, the third contact plug 241 may extend from the upper electrode 231 in the third direction Z. The third contact plug 241 and the upper electrode 231 may be electrically connected to each other. The third contact plug 241 may include, for example, a metal such as tungsten, copper, and aluminum.

A connector 300 may be formed on the lower electrode 201. For example, the connector 300 may be placed on one side of the lower electrode 201 to be spaced apart from the upper electrode 231. The connector 300 may have a shape that extends in the third direction Z.

The connector 300 may include a conductive filler 212, a dielectric film 222, an upper electrode 232 and a third contact plug 242. The conductive filler 212 may be formed on the lower electrode 201, and the dielectric film 222 may be formed to cover the conductive filler 212 and the lower electrode 201. Further, the upper electrode 232 may be formed to cover the dielectric film 222, and the third contact plug 242 may be formed on the upper electrode 232.

At least one of the conductive filler 212, the upper electrode 232 and the third contact plug 242 may include a metal such as tungsten, copper and aluminum. Further, the dielectric film 222 may be a single film or a multi-film structure of at least one oxide film among silicon, tungsten, copper, aluminum, titanium, tantalum, zirconium, and lanthanum.

The conductive filler 212, the dielectric film 222, the upper electrode 232 and the third contact plug 242 that constitute the connector 300 may be electrically connected to each other. Further, the connector 300 may be electrically connected to the lower electrode 201.

The connector 300 may be formed through the same process as the conductive fillers 210 and 211, the dielectric films 220 and 221, the upper electrode 231, and the third contact plug 241 that constitute the first capacitor C1 and the second capacitor C2. That is, the connector 300 may be formed at the same time when the first capacitor C1 and the second capacitor C2 are formed. In this case, the connector 300 may be understood as constituting a capacitor, which is different from the capacitor structure of the first capacitor C1 or the second capacitor C2. For example, a capacitor layer is disposed between the first metal layer 170 and a second metal layer 180. The capacitor layer includes the lower electrode 201 connected to the first metal layer 170, the upper electrode 232 connected to the second metal layer 180, the upper electrode 231 spaced apart from the upper electrode 232 and connected to the second metal layer 180, a capacitor disposed between the lower electrode 201 and the upper electrode 232, and a capacitor disposed between the lower electrode 201 and the upper electrode 231. However, the embodiments according to the disclosure is not limited thereto.

A connector 310 may be formed on the lower electrode 202. For example, the connector 310 may be placed on the lower electrode 202 to be spaced apart from the upper electrode 231 and the connector 300. The connector 310 may have a shape that extends in the third direction Z.

The connector 310 may include a conductive filler 213, a dielectric film 223, an upper electrode 233 and a third contact plug 243. The conductive filler 213 may be formed on the lower electrode 202, and the dielectric film 223 may be formed to cover the conductive filler 213 and the lower electrode 202. Further, the upper electrode 233 may be formed to cover the dielectric film 223, and the third contact plug 243 may be formed on the upper electrode 233.

At least one of the conductive filler 213, the upper electrode 233 and the third contact plug 243 may include a metal such as tungsten, copper and aluminum. Further, the dielectric film 223 may be a single film or a multi-film structure of at least one oxide film among silicon, tungsten, copper, aluminum, titanium, tantalum, zirconium, and lanthanum.

The conductive filler 213, the dielectric film 223, the upper electrode 233 and the third contact plug 243, which constitute the connector 310, may be electrically connected to each other. Further, the connector 310 may be electrically connected to the lower electrode 202.

The connector 310 may be formed through the same process as the conductive fillers 210 and 211, the dielectric films 220 and 221, the upper electrode 231, and the third contact plug 241, which constitute the first capacitor C1 and the second capacitor C2. That is, the connector 300 may be formed at the same time when the first capacitor C1 and the second capacitor C2 are formed. Further, the connector 310 may be formed at the same time as the connector 300 is formed. In this case, the connector 310 may be understood as constituting a capacitor, which is different from the capacitor structure of the first capacitor C1 or the second capacitor C2. For example, a capacitor layer is disposed between the first metal layer 170 and the second metal layer 180. The capacitor layer includes the lower electrode 202 connected to the first metal layer 170, the upper electrode 233 connected to the second metal layer 180, the upper electrode 233 spaced apart from the upper electrode 232 and connected to the second metal layer 180, a capacitor disposed between the lower electrode 201 and the upper electrode 232, and a capacitor disposed between the lower electrode 202 and the upper electrode 233.

A third interlayer insulating film 250 may cover the first metal layer 170, the first capacitor C1, the second capacitor C2, the connector 300 and the connector 310. However, the third interlayer insulating film 250 may not cover upper surfaces of the third contact plugs 241, 242 and 243. That is, the upper surfaces of the third contact plugs 241, 242 and 243 may be exposed to an upper surface of the third interlayer insulating film 250. The third interlayer insulating film 250 may include, for example, an insulating material.

The second metal layer 180 may be formed on the third interlayer insulating film 250. The second metal layer 180 may cover the third interlayer insulating film 250 and the third contact plugs 241, 242 and 243.

The second metal layer 180 may include a fourth interlayer insulating film 181, a second wiring 182, and a fourth contact plug 183.

The second wiring 182 may be formed on the third interlayer insulating film 250. The second wiring 182 may be formed on the third contact plugs 241, 242 and 243. The second wiring 182 may be electrically connected to the third contact plugs 241, 242 and 243. The second wiring 182 may include a metal such as tungsten, copper and aluminum.

The fourth contact plug 183 may be formed on the second wiring 182. The fourth contact plug 183 may extend from the upper surface of the second wiring 182. The fourth contact plug 183 may be formed to penetrate the fourth interlayer insulating film 181. The upper surface of the fourth contact plug 183 may be exposed to an upper surface of the fourth interlayer insulating film 181. The fourth contact plug 183 may include a metal such as tungsten, copper and aluminum.

The fourth interlayer insulating film 181 may cover the third interlayer insulating film 250, the second wiring 182, and the fourth contact plug 183. The fourth interlayer insulating film 181 may cover only side walls of the fourth contact plug 183, and may not cover an upper surface of the fourth contact plug 183. The fourth interlayer insulating film 181 may include an insulating material.

The connector 300 and the connector 310 may be placed between the first metal layer 170 and the second metal layer 180 to electrically connect the first metal layer 170 and the second metal layer 180. For example, the connector 300 may electrically connect the second contact plug 173 of the first metal layer 170 and the second wiring 182 of the second metal layer 180. For example, the connector 310 may electrically connect the second contact plug 173 of the first metal layer 170 and the second wiring 182 of the second metal layer 180. That is to say, the connectors 300 and 310 may be electrically connected to the gate electrodes 130, 132 and 134 through the first metal layer 170 or the second metal layer 180.

A third wiring 192 may be formed on the second metal layer 180. The third wiring 192 may be electrically connected to the second wiring 182 or the fourth contact plug 183. The third wiring 192 may include a metal such as tungsten, copper and aluminum. The fourth interlayer insulating film 191 may cover the second metal layer 180 and the third wiring 192.

A metal film 193 may be formed on the fourth interlayer insulating film 191. The metal film 193 may shield the pixel PX1 from an external electric field. Further, the metal film 193 may prevent light from entering the pixel PX1 from the outside. The metal film 193 may include a metal such as tungsten, copper and aluminum.

A protective film 194 may cover the metal film 193. The protective film 194 may include a silicon nitride film, polyimide, or the like.

A fixed charge film 112 may be placed on a lower surface of the substrate 100. That is, the fixed charge film 112 may be formed in the third direction Z from the substrate 100. The fixed charge film 112 may cover a surface of the substrate 100. For example, the fixed charge film 112 may include a metal oxide or a metal fluoride including at least one metal among hafnium (Hf), zirconium (Zr), aluminum (Al), tantalum (Ta), titanium (Ti), yttrium (Y) and lanthanoid.

A color filter 110 may be formed on the substrate 100 corresponding to the first region R1. For example, the color filter 110 may be formed on the fixed charge film 112 corresponding to the first region R1. The color filter 110 may allow only the light corresponding to a unique color to penetrate and provide the light to the first dopant injection region 120.

A light-shielding film 111 may be formed on the substrate 100 corresponding to the second region R2. For example, the light-shielding film 111 may be formed on the fixed charge film 112 corresponding to the second region R2. The light-shielding film 111 may be used to allow light to penetrate only the first region R1 and prevent light from entering the second region R2.

A microlens 113 may be formed on the color filter 110. Light may pass through the microlens 113 and be provided to the first dopant injection region 120. The microlens 113 may be placed only in the first region R1.

Referring to FIG. 7, a thickness of the upper electrode 233 may be a first thickness W1. Further, a thickness of the upper electrode 232 may be a second thickness W2. A thickness of the upper electrode 231 may be a third thickness W3. For example, the first thickness W1, the second thickness W2, and the third thickness W3 may be substantially the same. Here, the upper surface of the upper electrode 231, the upper surface of the upper electrode 232, and the upper surface of the upper electrode 233 may be substantially on the same plane.

Referencing FIG. 6 again, the connector 300 may be placed between the lower electrode 201 and the second wiring 182, and electrically connect the lower electrode 201 and the second wiring 182. The connector 300 may be electrically connected to the first capacitor C1 and the second capacitor C2. Also, the connector 300 may be electrically connected to at least one of the gate electrode 130, the gate electrode 132 and the gate electrode 134 through the first contact plug 161 or the like.

The connector 300 includes the conductive filler 212, the dielectric film 222, the upper electrode 232 and the third contact plug 242. The conductive filler 212, the dielectric film 222, the upper electrode 232 and the third contact plug 242 may be electrically connected to each other. Accordingly, the connector 300 may electrically connect the first metal layer 170 and the second metal layer 180.

The connector 310 includes the conductive filler 213, the dielectric film 223, the upper electrode 233 and the third contact plug 243. The conductive filler 213, the dielectric film 223, the upper electrode 233 and the third contact plug 243 may be electrically connected to each other. Accordingly, the connector 310 may electrically connect the first metal layer 170 and the second metal layer 180.

The connector 300 may be placed to be spaced apart from the connector 310, the first capacitor C1 and the second capacitor C2. The connector 310 may be placed to be spaced apart from the connector 300, the first capacitor C1 and the second capacitor C2.

Here, the connector 300 and the connector 310 may be formed by the same process as the first capacitor C1, the second capacitor C2, the third contact plug 242, and the third contact plug 243. That is, the conductive fillers 210, 211, 212 and 213 may be formed by the same process, the dielectric films 220, 221, 222 and 223 may be formed by the same process, the upper electrodes 231, 232 and 233 may be formed by the same process, and the third contact plugs 241, 242 and 243 may be formed by the same process.

In the related art, a via which connects the existing first metal layer 170 and the second metal layer 180 is provided, and a length of the via corresponds a distance between the first metal layer 170 and the second metal layer 180. However, according to an example embodiment, the connector 300 and the connector 310 are formed by the same process as the first capacitor C1, the second capacitor C2, the third contact plug 242, and the third contact plug 243. Accordingly, a stable process of forming the pixel PX1 of the image sensor 1100 may be secured accordingly.

The connector 300 and the connector 310 may be connected to a transistor or the like to transmit a signal that controls the operation of the transistor. For example, the connectors 300 and 310 may be electrically connected to the gate electrodes 130, 132 and 134. For example, the connectors 300 and 310 may be electrically connected to the second dopant injection region 140 or the third dopant injection region 150. The transistors of the circuit may be turned on or off by the signals transmitted by the connectors 300 and 310 accordingly. However, the embodiment according to the disclosure is not limited thereto.

FIGS. 8 to 12 are diagrams for explaining a method for fabricating the pixels of FIGS. 5 and 6.

Figure 8:
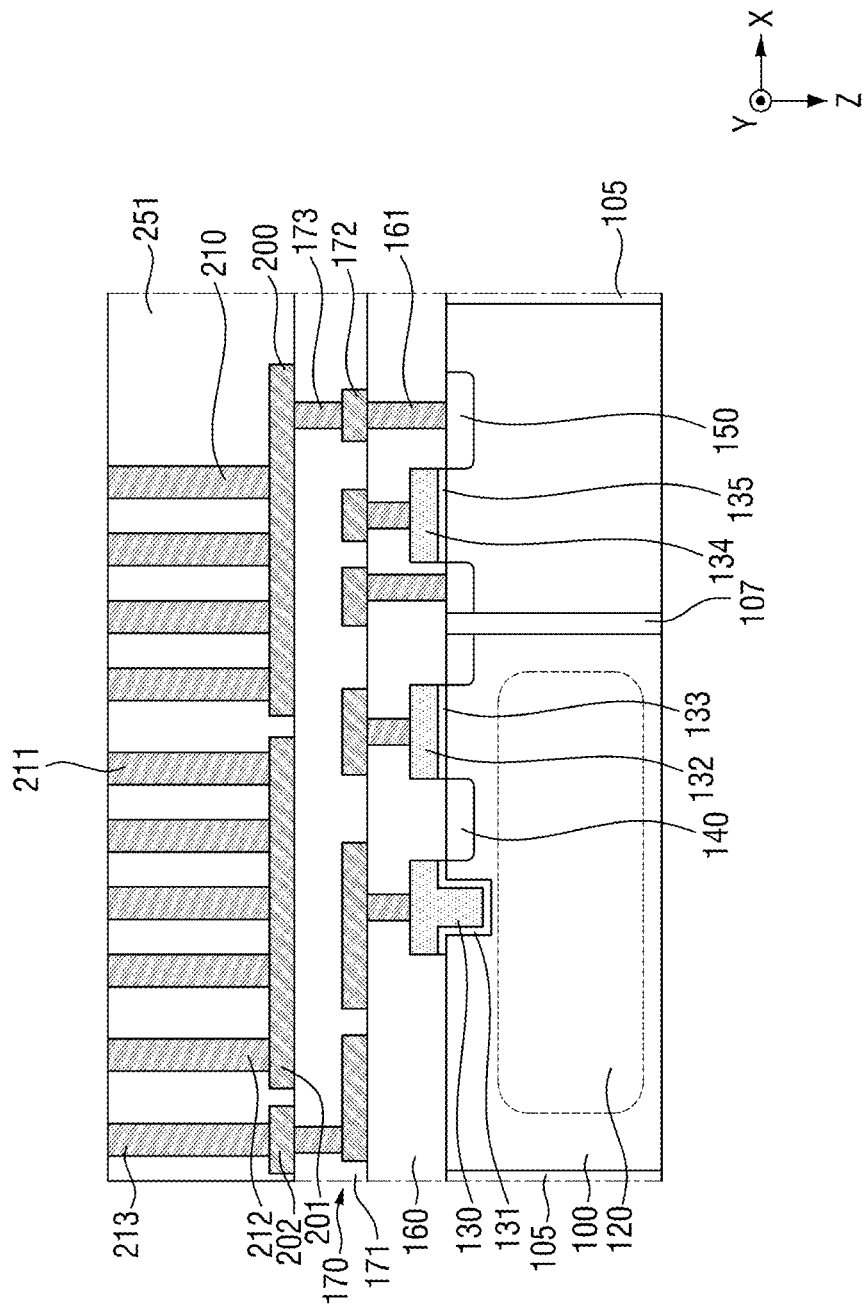
FIGS. 8, 9, 10, 11, and 12 are diagrams for explaining a method for fabricating the pixel of FIGS. 5 and 6.

Referring to FIG. 8, the first conductive type dopant may be doped into the substrate 100. For example, the first conductive type dopant may be doped in the first dopant injection region 120 in the substrate 100. Further, the region of the substrate 100 except the first dopant injection region 120 may be doped with a second conductive type dopant different from the first conductive type.

The element isolation film 105 may be formed along an outer wall of the substrate 100, and the element isolation film 107 may be formed in the substrate 100 and separate the substrate 100.

The gate electrodes 130, 132 and 134 and the gate insulating films 131, 133 and 135 may be formed on the substrate 100 according to an existing method. The second dopant injection region 140 and the third dopant injection region 150 may be formed on the substrate 100 between the gate electrodes 130, 132 and 134.

The first interlayer insulating film 160 and the first contact plug 161 may be formed on the gate electrodes 130, 132 and 134, the second dopant injection region 140, and the third dopant injection region 150. The second interlayer insulating film 171, the first wiring 172 and the second contact plug 173 may be formed on the first interlayer insulating film 160 and the first contact plug 161.

Lower electrodes 200, 201 and 202 may be formed on the second interlayer insulating film 171. The lower electrodes 200, 201 and 202 may be formed by stacking and patterning a conductive film on the second interlayer insulating film 171. A mold film 251 may cover the lower electrodes 200, 201 and 202.

Via holes are formed in the mold film 251, and conductive fillers 210, 211, 212 and 213 may be formed by filling the via holes with metal. That is, the conductive filler 210 is formed to be connected to the lower electrode 200, the conductive fillers 211 and 212 are formed to be connected to the lower electrode 201, and the conductive filler 213 may be formed to be connected to the lower electrode 202.

Figure 9:
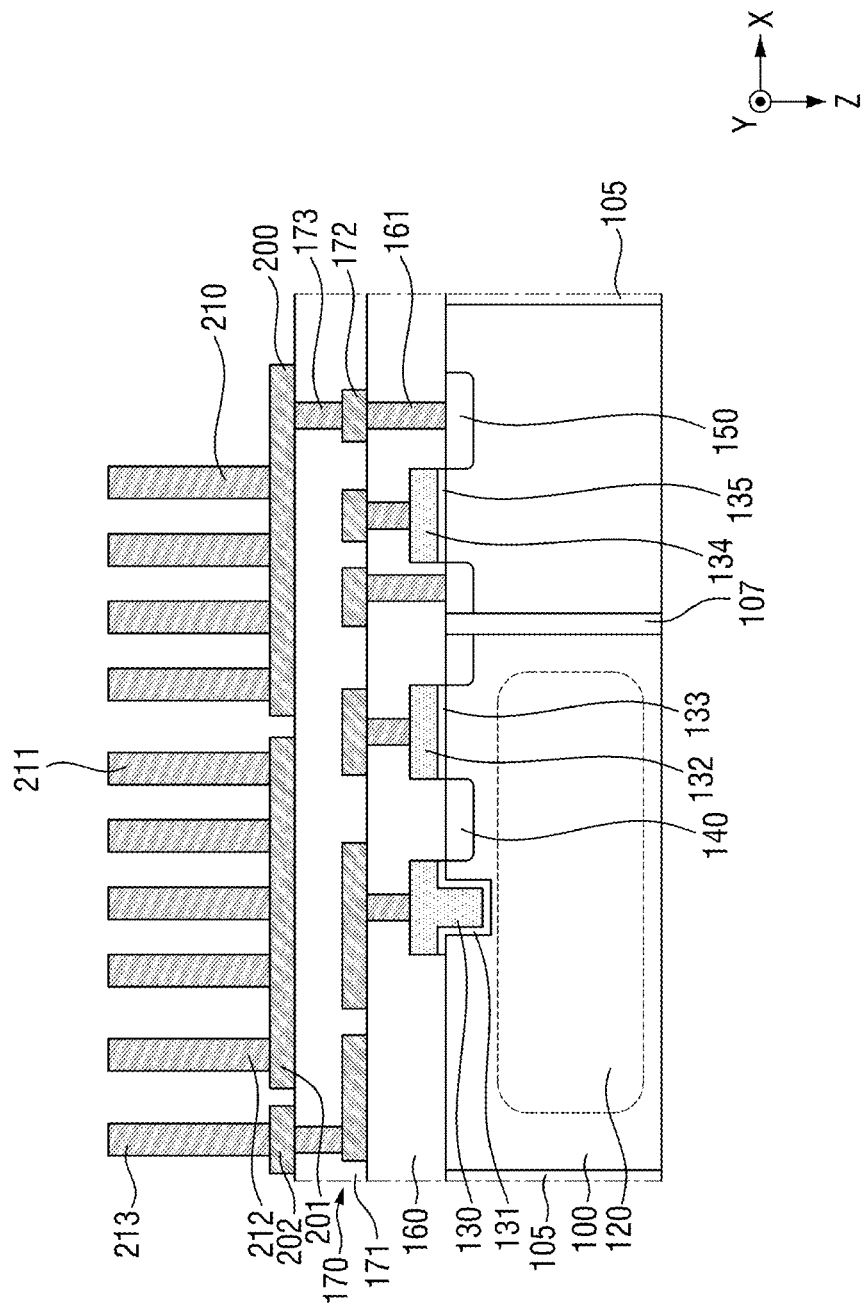

Referring to FIG. 9, the mold film 251 may be removed. Here, by removing the mold film 251, the second interlayer insulating film 171, the lower electrodes 200, 201 and 202 and the conductive filler 210, 211, 212 and 213 may be exposed.

Figure 10:
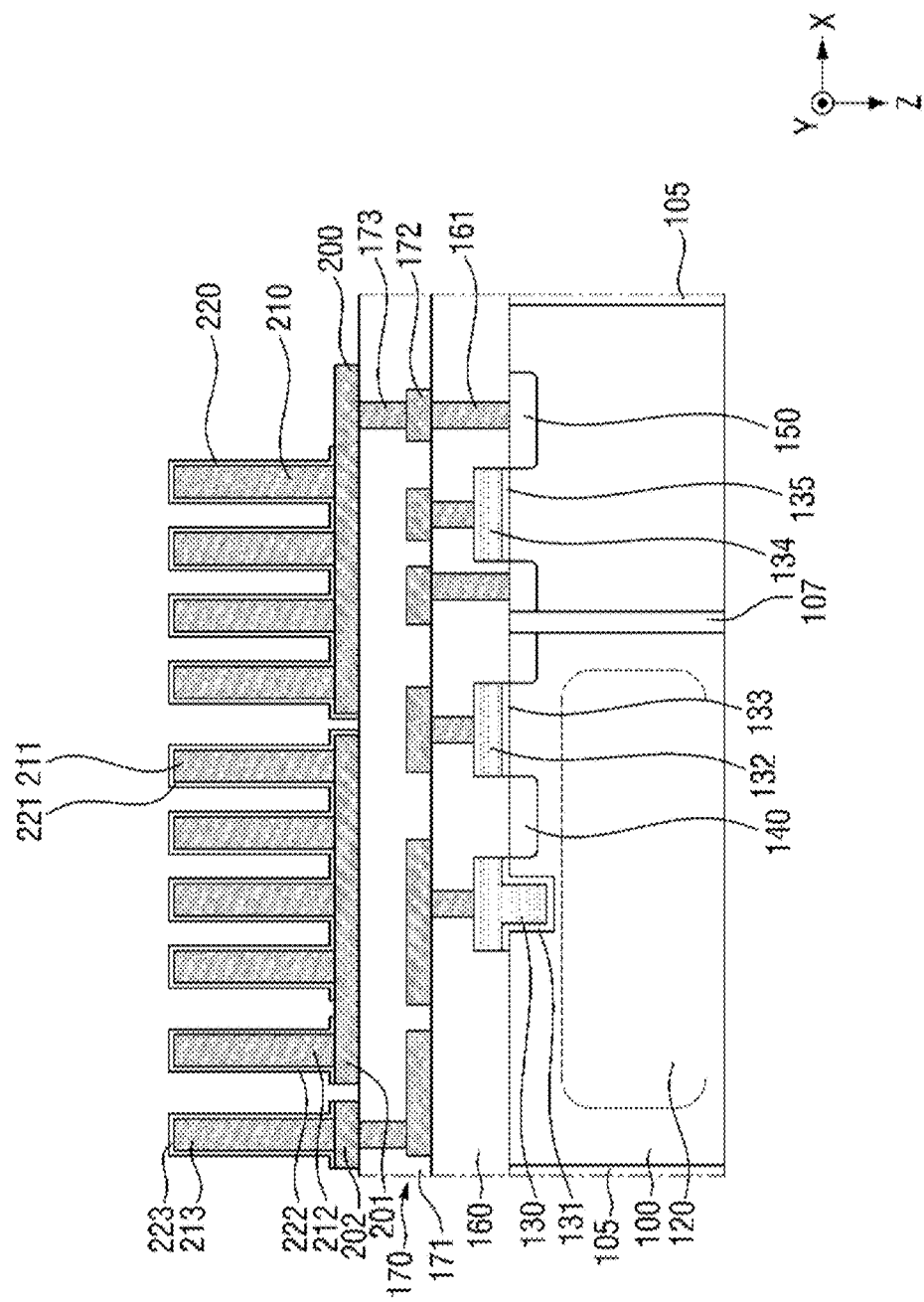

Referring to FIG. 10, the dielectric film 220 may be formed to cover the conductive filler 210 and a part of the lower electrode 200. The dielectric film 220 may not cover the other part of the lower electrode 200. The dielectric film 221 may be formed to cover the conductive filler 211 and a part of the lower electrode 201. The dielectric film 221 may not cover the other part of the lower electrode 201.

The dielectric film 222 may be formed to cover the conductive filler 212 and a part of the lower electrode 201. The dielectric film 222 may not cover the other part of the lower electrode 201. Accordingly, the dielectric film 221 and the dielectric film 222 may be spaced apart from each other. The dielectric film 223 may be formed to cover the conductive filler 213 and the lower electrode 202.

Figure 11:
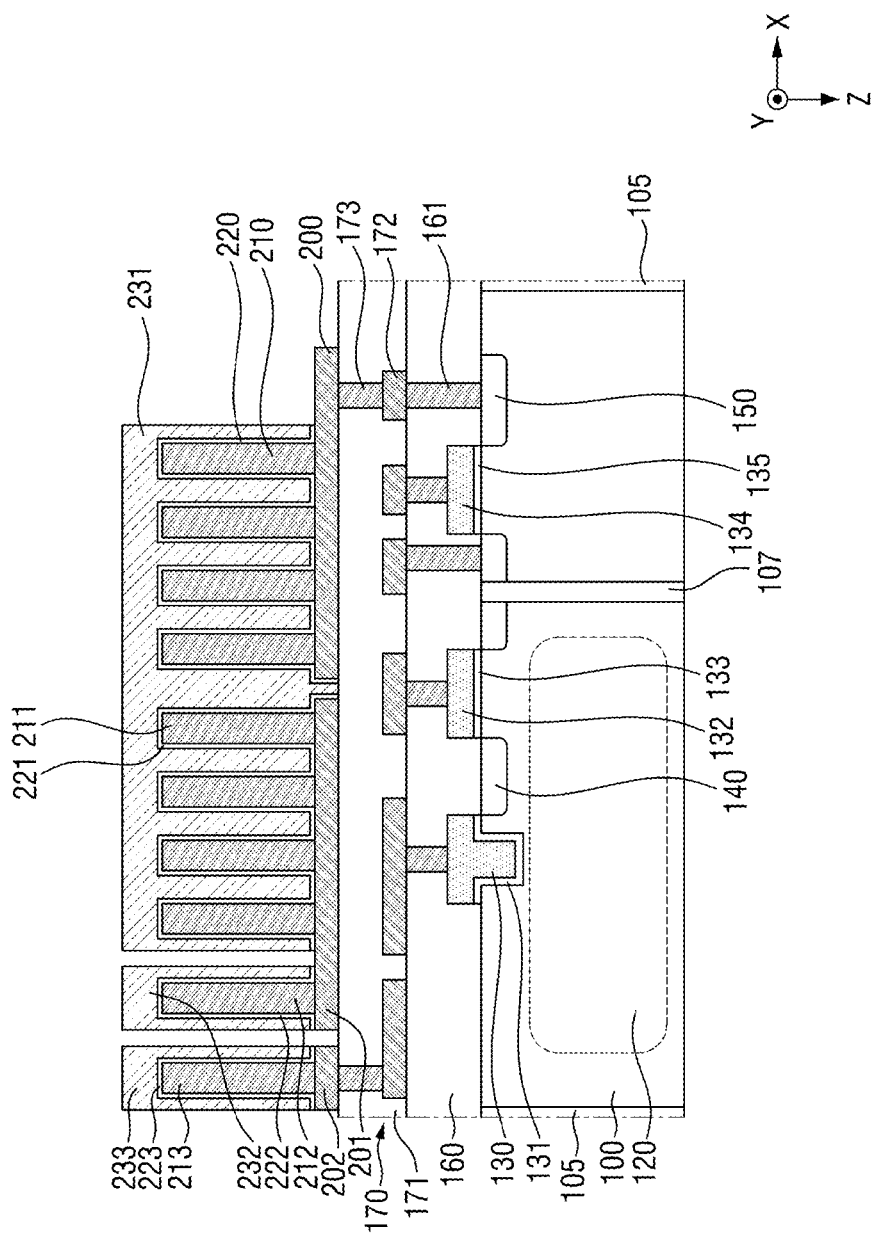

Referring to FIG. 11, the upper electrode 231 may be formed to cover the dielectric film 220, the dielectric film 221 and a part of the second interlayer insulating film 171. The upper electrode 232 may be formed to cover the dielectric film 222. The upper electrode 233 may be formed to cover the dielectric film 223. The upper electrodes 231, 232 and 233 may be formed to be spaced apart from each other.

Figure 12:
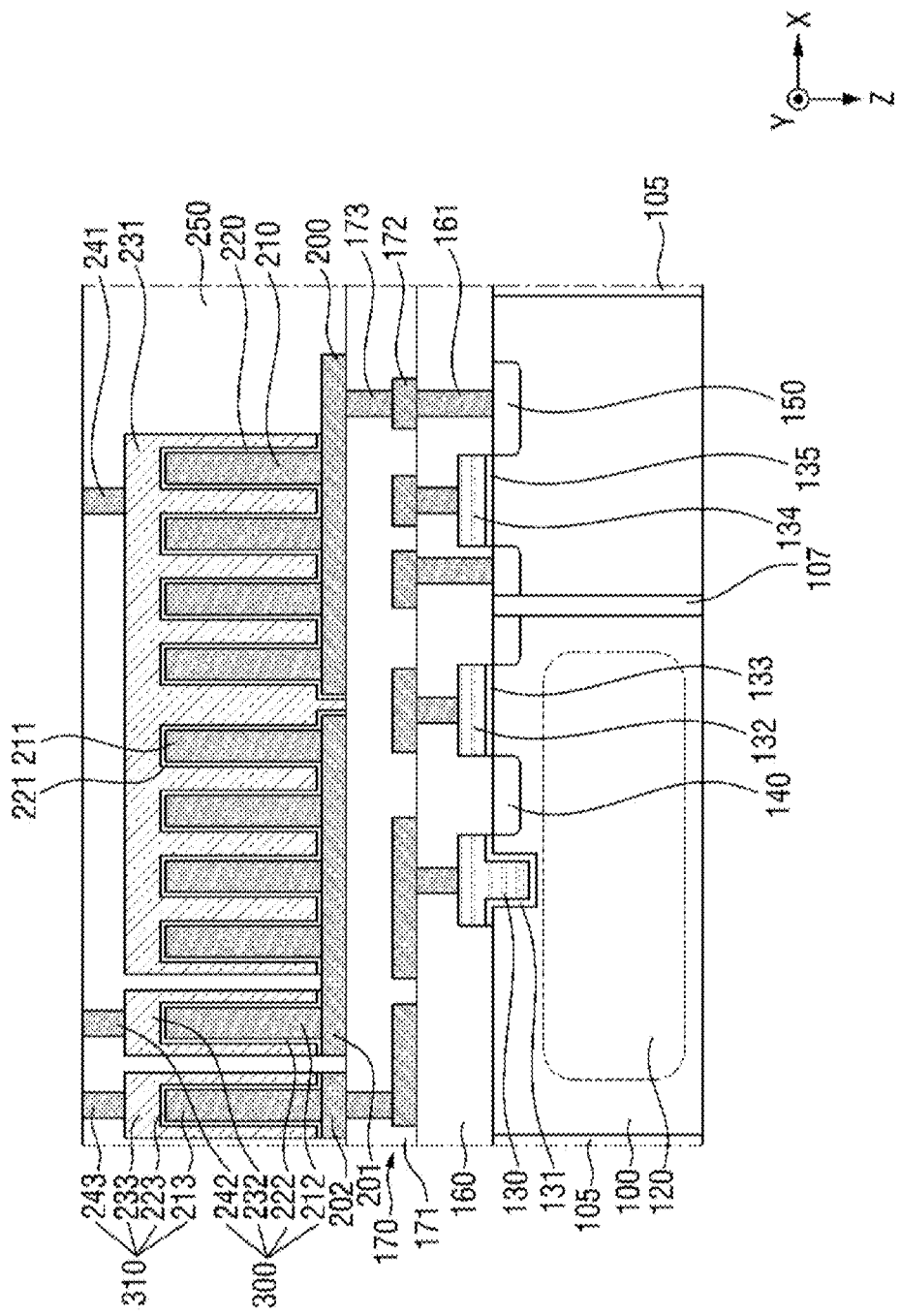

Referring to FIG. 12, the third interlayer insulating film 250 may be formed on the second interlayer insulating film 171 to cover the first capacitor C1, the second capacitor C2, the upper electrode 232 and the upper electrode 233. The third contact plug 241 may be formed in the third interlayer insulating film 250 and be connected to the upper electrode 231. The third contact plug 242 may be formed in the third interlayer insulating film 250 and be connected to the upper electrode 232. The third contact plug 243 may be formed in the third interlayer insulating film 250 and be connected to the upper electrode 233. As a result, the first capacitor C1, the second capacitor C2, the connector 300 and the connector 310 may be formed.

Hereinafter, a pixel PX2 of an image sensor according to some other example embodiments will be explained referring to FIGS. 13 and 14.

Figure 13:
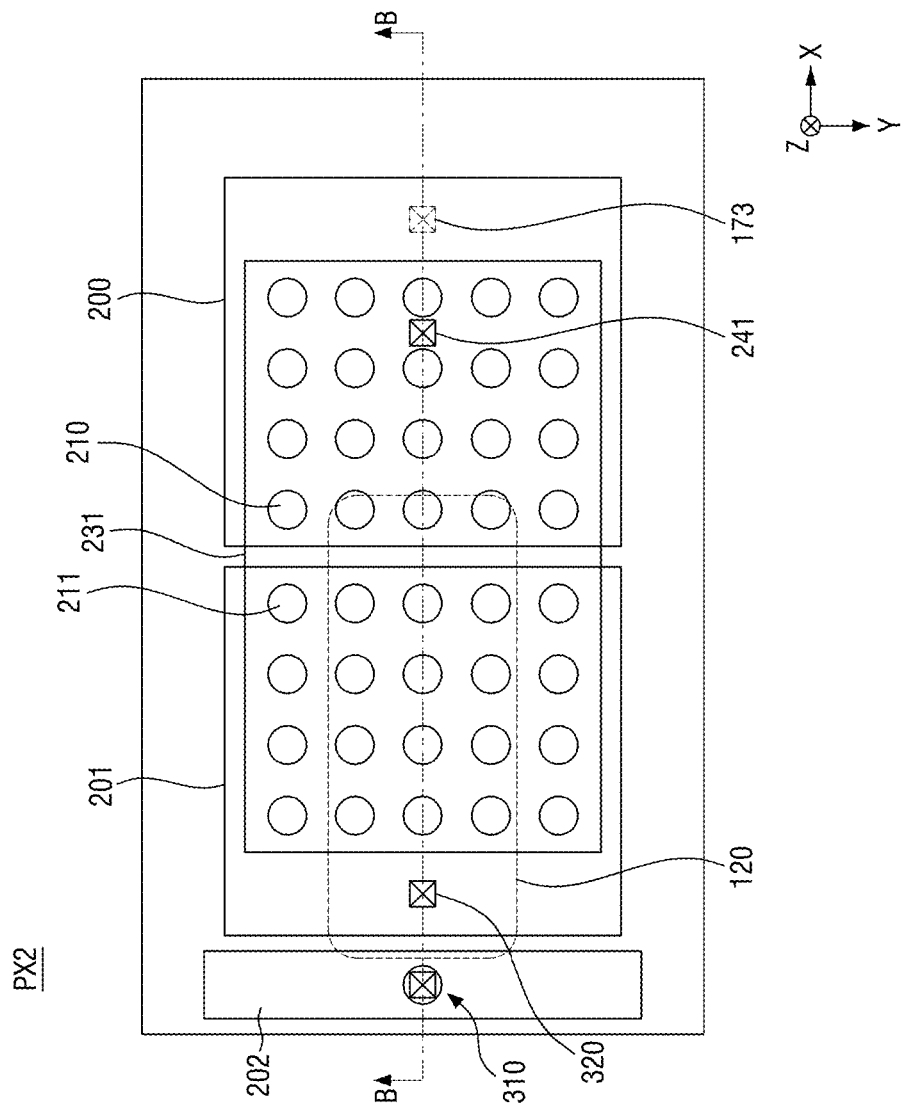
FIG. 13 is a diagram showing a layout of a pixel according to some example embodiments.

FIG. 13 is a diagram showing a layout of the pixel according to some example embodiments. FIG. 14 is a cross-sectional view of the pixel taken along B-B of FIG. 13. For convenience of explanation, overlapping parts with those of example embodiments described with reference to FIGS. 1 to 12 will be briefly explained or omitted.

Figure 14:
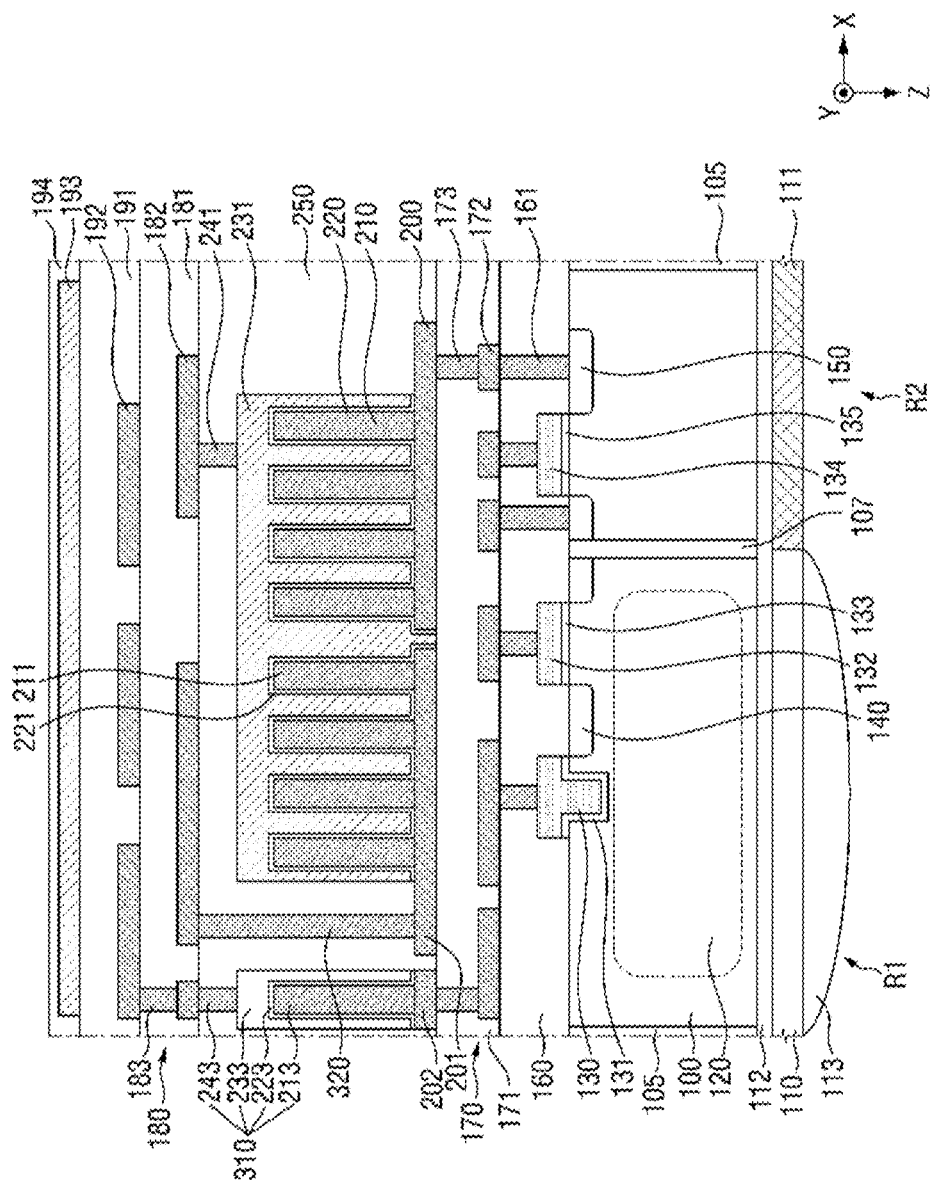
FIG. 14 is a cross-sectional view of the pixel taken along B-B of FIG. 13.

Referring to FIGS. 13 and 14, the pixel PX2 may include a contact plug 320. The contact plug 320 may be placed between the lower electrode 201 and the second wiring 182. That is, unlike FIGS. 5 and 6, the pixel PX2 does not include the connector 300 and may instead include the contact plug 320.

The contact plug 320 may electrically connect the first metal layer 170 and the second metal layer 180. That is, the contact plug 320 may electrically connect the lower electrode 201 and the second wiring 182. The contact plug 320 may be placed to be spaced apart from the first capacitor C1, the second capacitor C2 and the connector 310. The contact plug 320 may include, for example, a metal such as tungsten, copper, and aluminum.

The contact plug 320 may be formed in the third interlayer insulating film 250 after the first capacitor C1, the second capacitor C2 and the connector 310 are formed. That is, the contact plug 320 may not be formed by the same process as the first capacitor C1, the second capacitor C2 and the connector 310.

The contact plug 320 may transmit signals between the first capacitor C1 and the second wiring 182. Here, the signal transmitted through the contact plug 320 may be faster than the signal transmitted through the connector 310.

Hereinafter, a pixel PX3 of an image sensor according to some other example embodiments will be explained referring to FIGS. 15 and 16.

Figure 15:
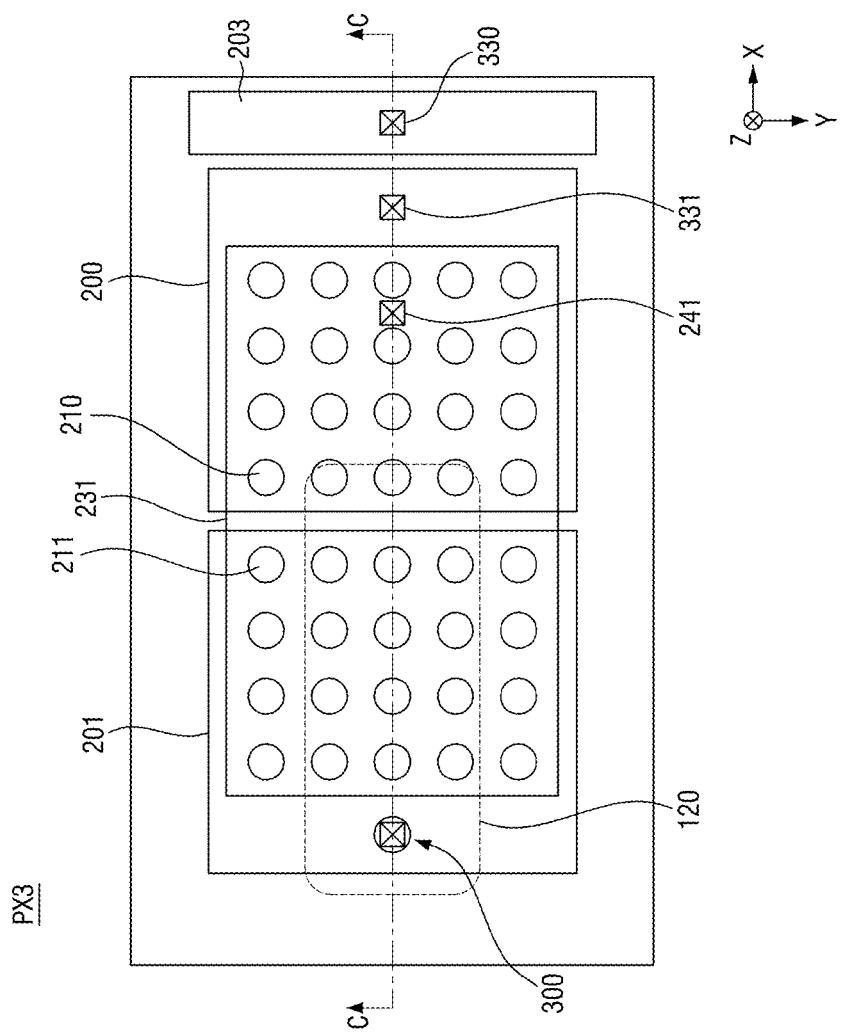
FIG. 15 is a diagram showing a layout of a pixel according to some example embodiments.

FIG. 15 is a diagram showing a layout of the pixel according to some example embodiments. FIG. 16 is a cross-sectional view of the pixel taken along C-C of FIG. 15. For convenience of explanation, overlapping parts with those of example embodiments described with reference to FIGS. 1 to 12 will be briefly explained or omitted.

Figure 16:
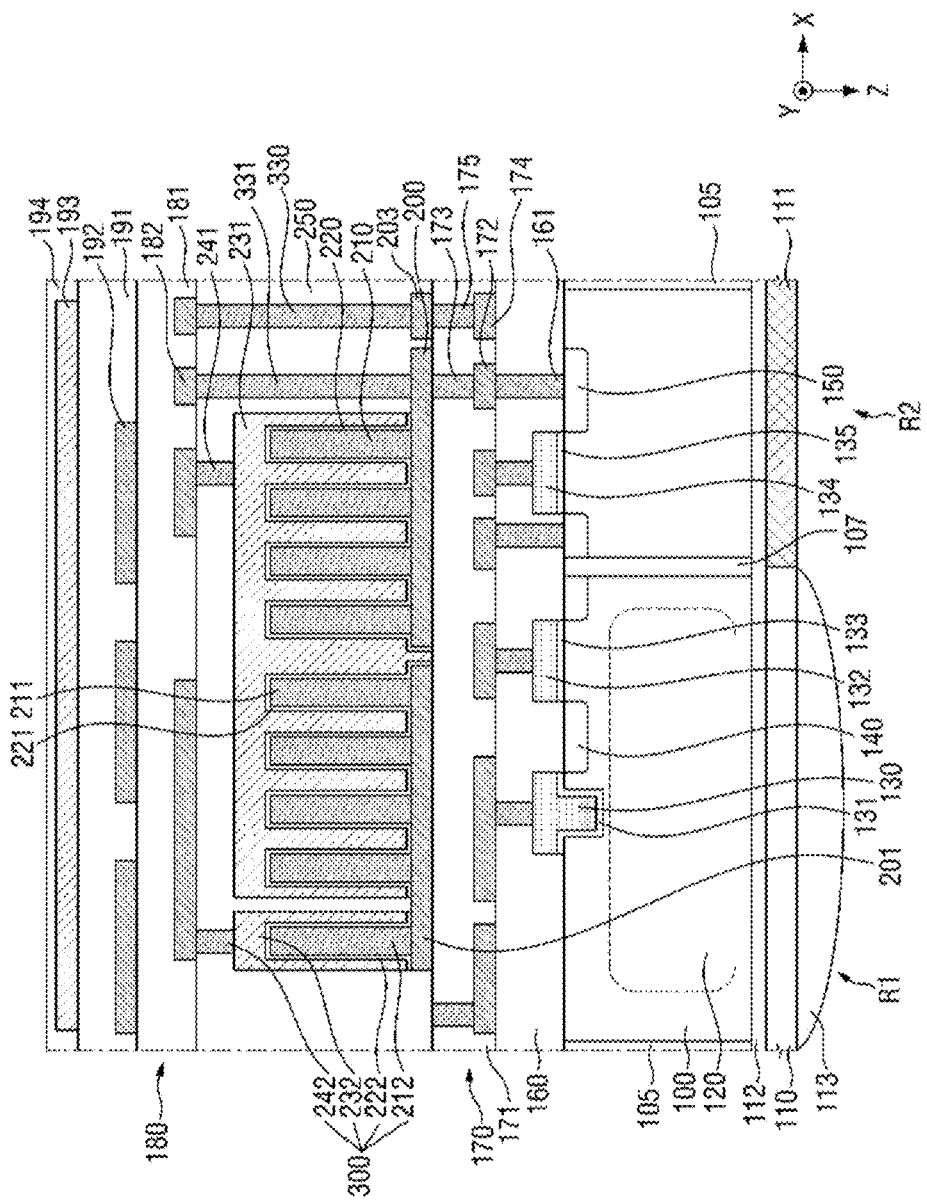
FIG. 16 is a cross-sectional view of the pixel taken along C-C of FIG. 15.

Referring to FIGS. 15 and 16, the pixel PX3 may include a first wiring 174, a second contact plug 175, a lower electrode 203, a contact plug 330 and a contact plug 331. Here, the connector 300 may electrically connect the first metal layer 170 and the second metal layer 180. However, unlike the pixel PX1 explained using FIGS. 5 and 6, the connector 310 may not be provided.

The first wiring 174 and the second contact plug 175 may be placed in the first metal layer 170. The lower electrode 203 may be placed on the first metal layer 170. The lower electrode 203 may be electrically connected to the first wiring 174 and the second contact plug 175.

The contact plug 330 may be placed between the first metal layer 170 and the second metal layer 180. The contact plug 330 may electrically connect the first metal layer 170 and the second metal layer 180. For example, the contact plug 330 may electrically connect the lower electrode 203 and the second wiring 182.

The contact plug 331 may be placed between the first metal layer 170 and the second metal layer 180. The contact plug 331 may electrically connect the first metal layer 170 and the second metal layer 180. For example, the contact plug 331 may electrically connect the lower electrode 200 and the second wiring 182.

For example, a length of the contact plug 330 may be greater than a length of the third contact plug 242. The length of the contact plug 331 may be greater than a length of the third contact plug 242.

The contact plugs 330 and 331 may include, for example, a metal such as tungsten, copper and aluminum. The contact plugs 330 and 331 may transmit signals between the first metal layer 170 and the second metal layer 180. Here, the signals transmitted through the contact plugs 330 and 331 may be faster than the signals transmitted through the connector 300.

Hereinafter, a pixel PX4 of an image sensor and a method for fabricating the same according to some other example embodiments will be explained referring to FIGS. 17 and 22.

Figure 17:
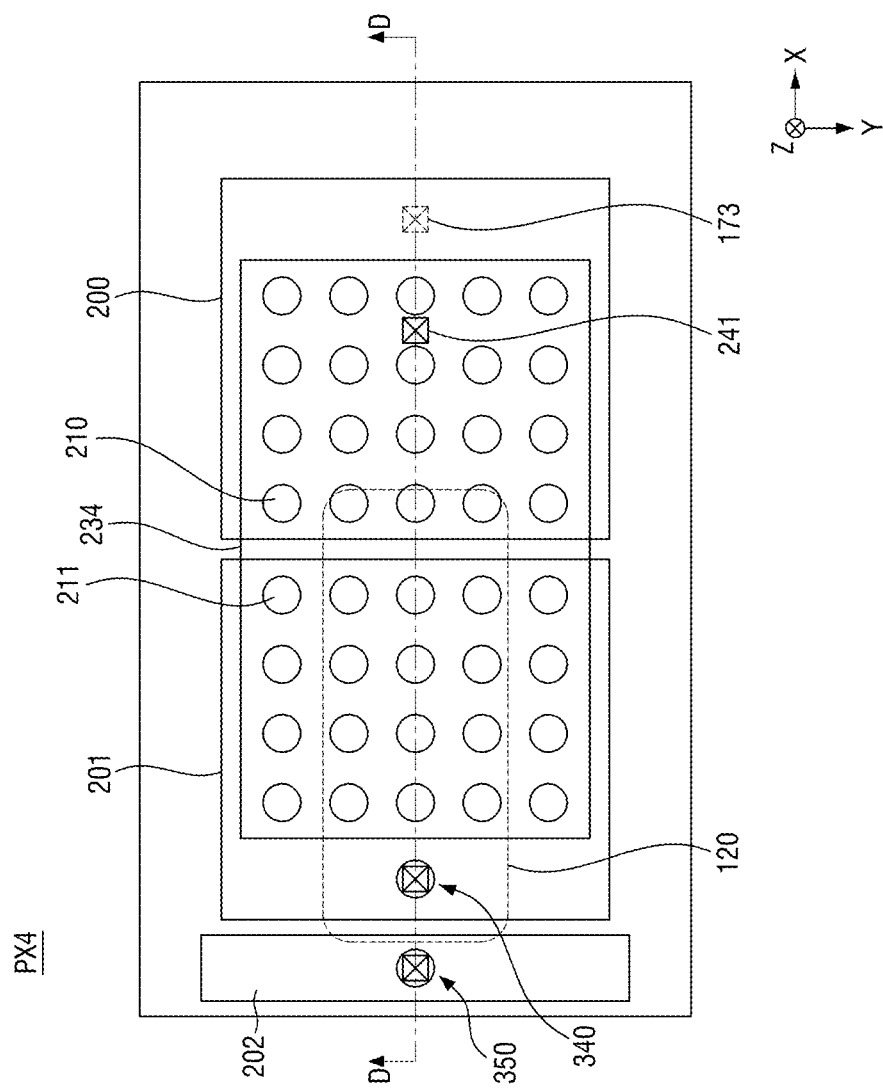
FIG. 17 is a diagram showing a layout of a pixel according to some example embodiments.
Figure 18:
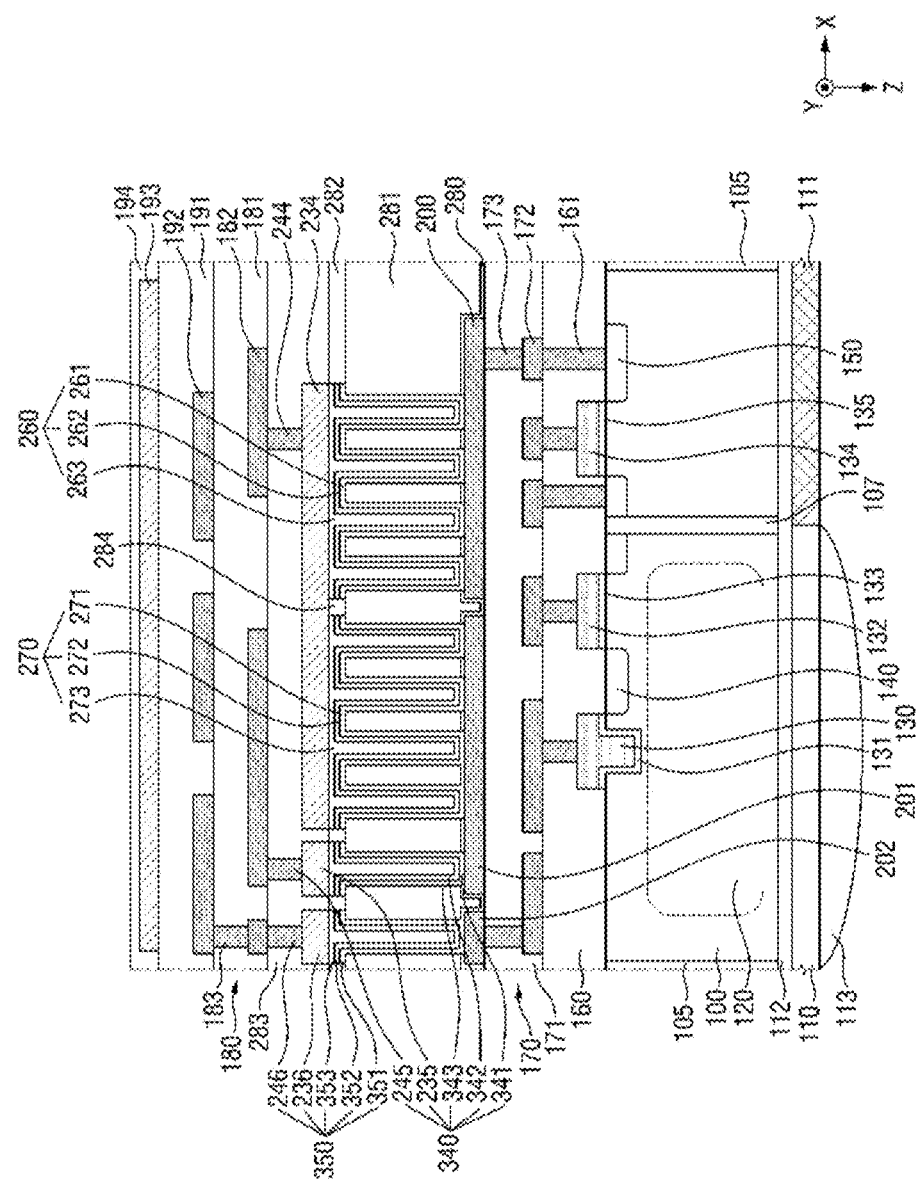
FIG. 18 is a cross-sectional view of the pixel taken along D-D of FIG. 17.

FIG. 17 is a diagram showing a layout of the pixel PX4 according to some example embodiments. FIG. 18 is a cross-sectional view of the pixel PX4 taken along D-D of FIG. 17. FIGS. 19 to 22 are diagrams for explaining a method for fabricating the pixel PX4 of FIGS. 17 and 18. For convenience of explanation, overlapping parts with those of example embodiments described with reference to FIGS. 1 to 12 will be briefly explained or omitted.

Referring to FIGS. 17 and 18, the pixel PX4 may include an etching blocking film 280, a dielectric film 260, a dielectric film 270, a connector 340, a connector 350, a mold layer 281, an insulating layer 282, an upper electrode 234, a contact plug 244, an insulating layer 283, and an auxiliary insulating layer 284. That is, the pixel PX4 may not include the conductive fillers 210, 211, 212 and 213 of the pixel PX1.

Figure 19:
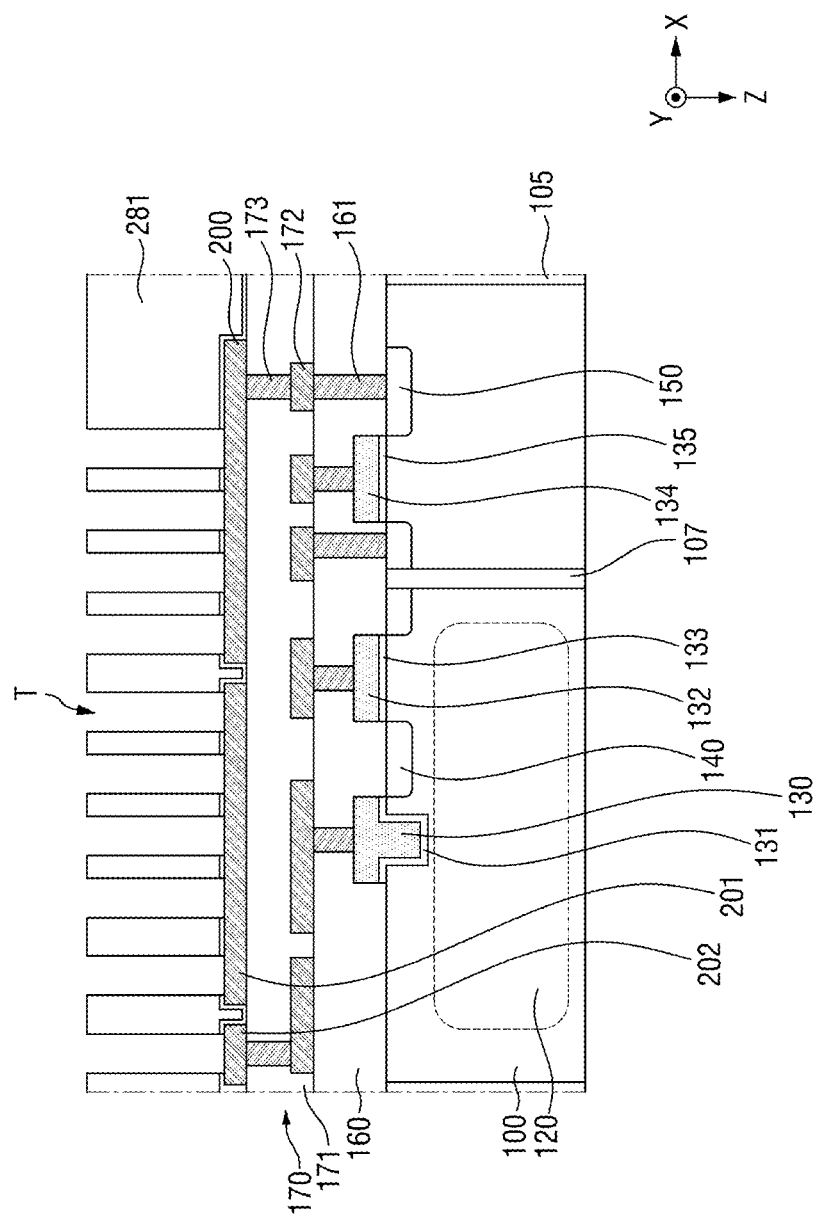
FIGS. 19, 20, 21, and 22 are diagrams for explaining a method for fabricating the pixel of FIGS. 17 and 18.

Referring to FIG. 19, the etching blocking film 280 may cover the second interlayer insulating film 171 and the lower electrodes 200, 201 and 202. The mold layer 281 may cover the etching blocking film 280. Further, a trench T may be formed by etching the mold layer 281 and the etching blocking film 280.

Figure 20:
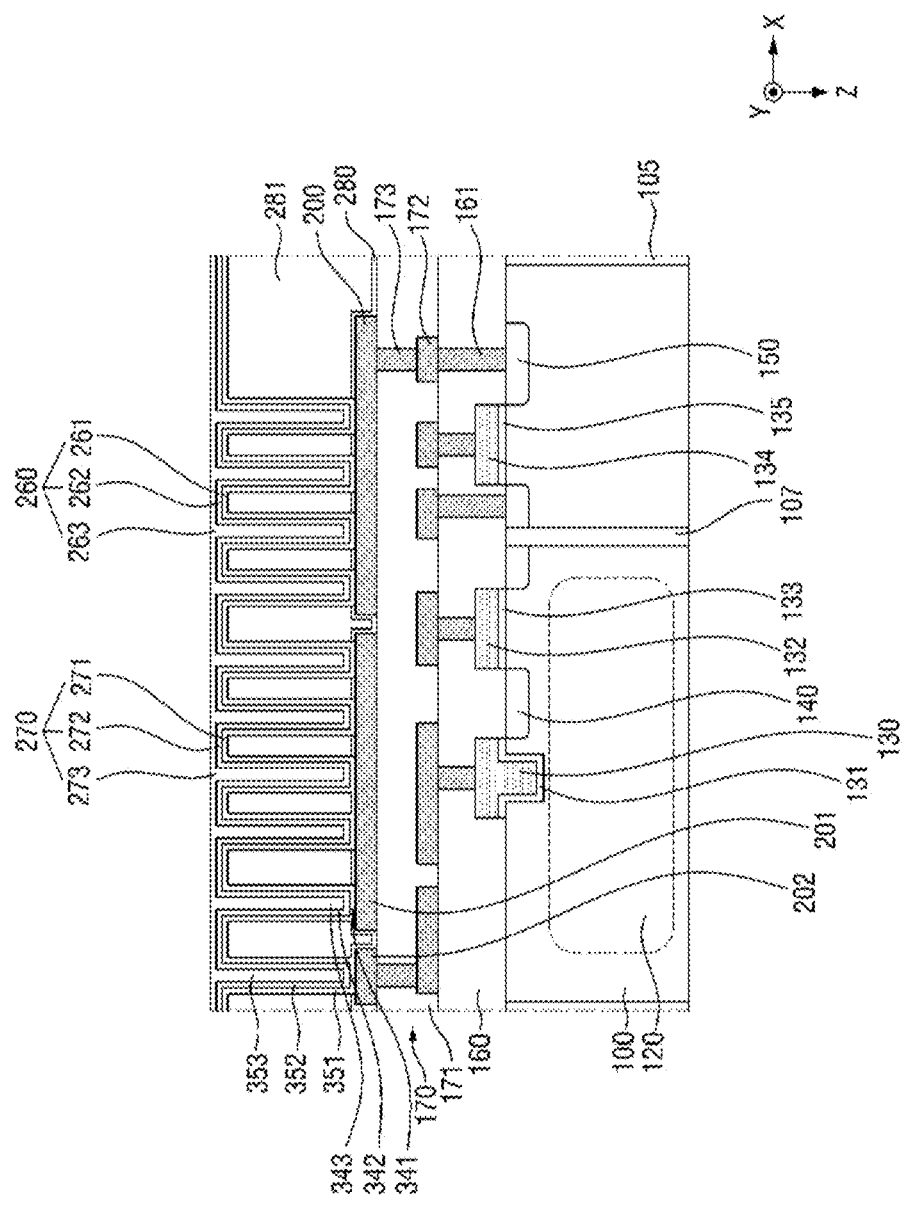

Referring to FIG. 20, the dielectric film 260, the dielectric film 270, the connector 340 and the connector 350 may be formed in the trench T.

The dielectric film 260 may be formed on the lower electrode 200. That is, the dielectric film 260 may be formed, by filling a first dielectric film 261, a second dielectric film 262, and a third dielectric film 263 in the trench T formed in the mold layer 281.

The dielectric film 270 may be formed on the lower electrode 201. That is, the dielectric film 270 may be formed, by filling a first dielectric film 271, a second dielectric film 272, and a third dielectric film 273 in the trench T formed in the mold layer 281.

A first dielectric film 341 may be formed along the trench T formed in the mold layer 281 on the lower electrode 201. A second dielectric film 342 may be placed on the first dielectric film 341, and a third dielectric film 343 may be placed on the second dielectric film 342.

A first dielectric film 351 may be formed along the trench T formed in the mold layer 281 on the lower electrode 202. A second dielectric film 352 may be placed on the first dielectric film 351, and a third dielectric film 353 may be placed on the second dielectric film 352.

Here, the first dielectric films 261, 271, 341 and 351, the second dielectric films 262, 272, 342 and 352, and the third dielectric films 263, 273, 343 and 354 may include different materials from each other. For example, the first dielectric films 261, 271, 341 and 351 may include an aluminum oxide film. For example, the second dielectric films 262, 272, 342 and 352 may include a silicon oxide film. For example, the third dielectric films 263, 273, 343 and 354 may include a zirconium oxide film. However, the embodiment according to the disclosure is not limited thereto.

Figure 21:
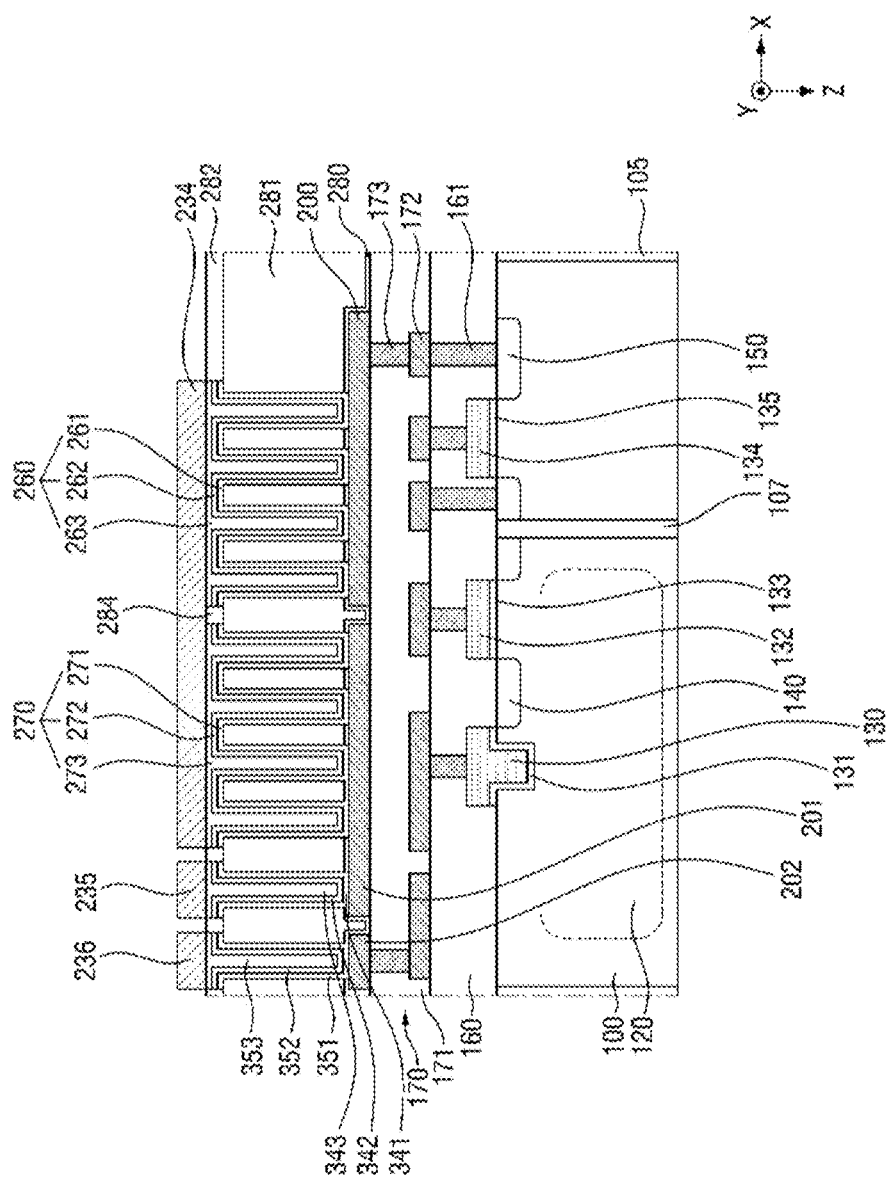

Referring to FIG. 21, the insulating layer 282 may be formed on the mold layer 281. Further, the auxiliary insulating layer 284 may be formed on the mold layer 281 to separate the dielectric film 260, the dielectric film 270, the connector 340 and the connector 350 from each other.

The upper electrode 234 may be formed on the dielectric film 260 and the dielectric film 270. An upper electrode 235 may be formed on the third dielectric film 343. An upper electrode 236 may be formed on the third dielectric film 353.

Figure 22:
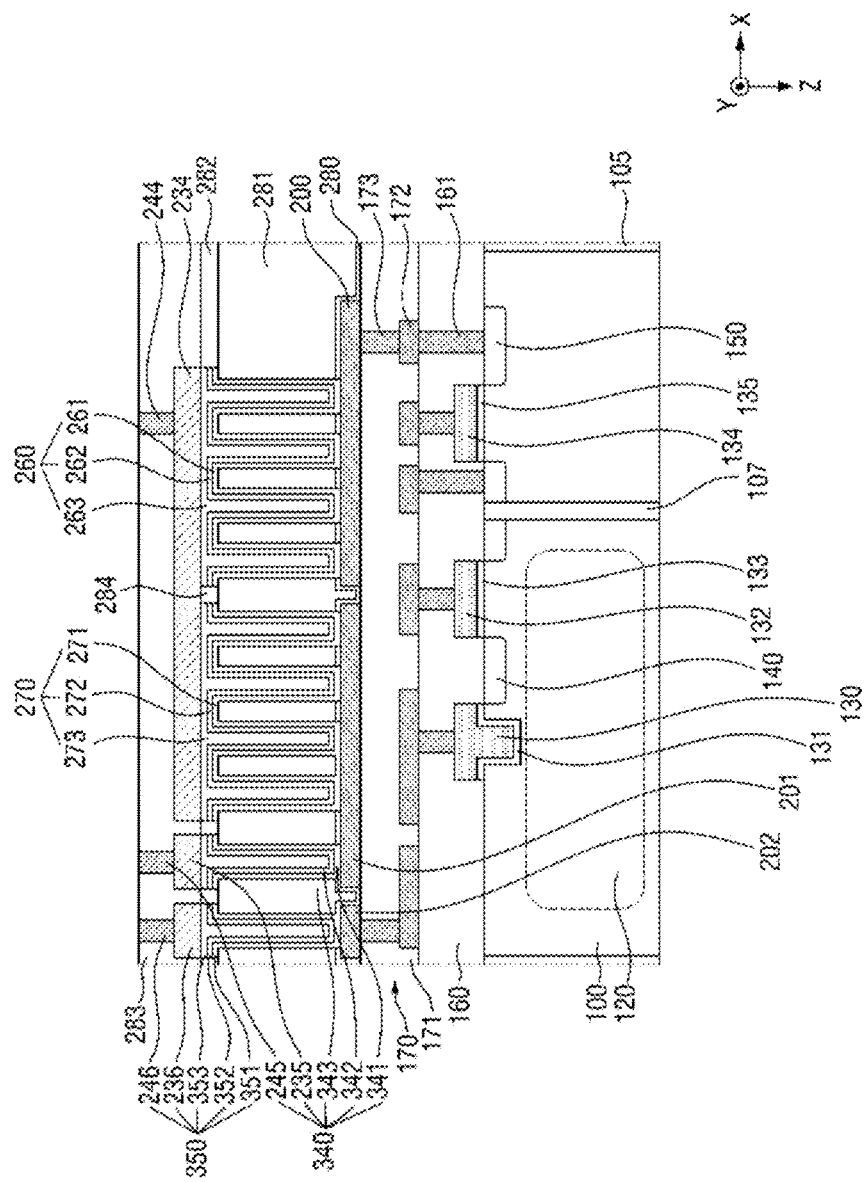

Referring to FIG. 22, the insulating layer 283 may cover the insulating layer 282 and the upper electrodes 234, 235 and 236. The contact plug 244 may be formed on the upper electrode 234. The contact plug 245 may be formed on the upper electrode 235. The contact plug 246 may be formed on the upper electrode 236.

As a result, the connector 340 and the connector 350 may be formed. That is, the connector 340 may include the first dielectric film 341, the second dielectric film 342, the third dielectric film 343, the upper electrode 235 and the contact plug 245. The connector 350 may include the first dielectric film 351, the second dielectric film 352, the third dielectric film 353, the upper electrode 236 and the contact plug 246.

Referring to FIG. 18 again, the connector 340 and the connector 350 may electrically connect the first metal layer 170 and the second metal layer 180. That is, the connector 340 may electrically connect the lower electrode 201 and the second wiring 182, and the connector 350 may electrically connect the lower electrode 202 and the second wiring 182. That is, because the connector 340 and the connector 350 are used for the pixel PX4, a stable process of the pixel PX4 of the image sensor 1100 may be ensured.

Hereinafter, a pixel PX5 of an image sensor according to some other example embodiments will be explained referring to FIG. 23.

Figure 23:
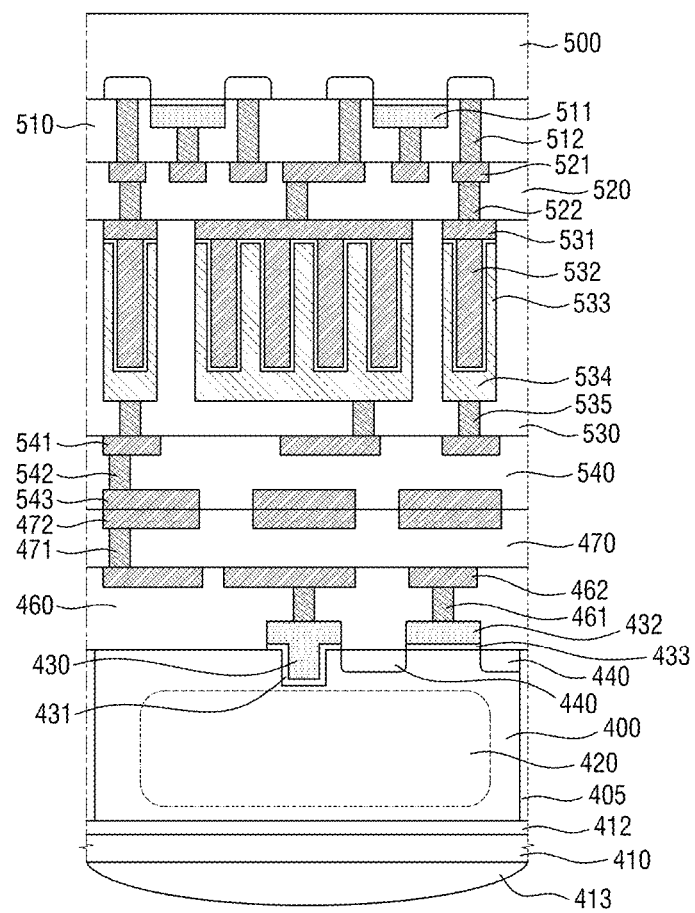
FIG. 23 is a diagram showing a cross-section of a pixel according to some example embodiments.

FIG. 23 is a diagram showing a cross-section of the pixel according to some example embodiments. For convenience of explanation, overlapping parts with those of example embodiments described with reference to FIGS. 1 to 12 will be briefly explained or omitted.

Referring to FIG. 23, the pixel PX5 may include a substrate 400, an element isolation film 405, a color filter 410, a fixed charge film 412, a microlens 413, a first dopant injection region 420, gate electrodes 430 and 432, gate insulating films 431 and 433, a second dopant injection region 440, an interlayer insulating film 460, a contact plug 461, a wiring 462, an interlayer insulating film 470, a contact plug 471, and a wiring 472.

Here, the substrate 400, the element separation film 405, the color filter 410, the fixed charge film 412, the microlens 413, the first dopant injection region 420, the gate electrodes 430 and 432, the gate insulating films 431 and 433, the second dopant injection region 440, the interlayer insulating film 460, the contact plug 461, the wiring 462, the interlayer insulating film 470, and the contact plug 471 of the pixel PX5 may be formed in the same manner as the substrate 100, the element separation film 105, the color filter 110, the fixed charge film 112, the microlens 113, the first dopant injection region 120, the gate electrodes 130 and 132, the gate insulating films 131 and 133, the second dopant injection region 140, the first interlayer insulating film 160, the first contact plug 161, the first wiring 172, the second interlayer insulating film 171, and the second contact plug 173 of pixel PX1 shown in FIG. 6.

A gate electrode 511 may be formed on a substrate 500. An interlayer insulating film 510 may cover the substrate 500 and the gate electrode 511. A contact plug 512 may extend to penetrate the interlayer insulating film 510.

A wiring 521 may be formed on the interlayer insulating film 510 and the contact plug 512. The wiring 521 may be electrically connected to the contact plug 512. An interlayer insulating film 520 may cover the interlayer insulating film 510 and the contact plug 512. A contact plug 522 may penetrate the interlayer insulating film 520 and be connected to the wiring 521.

A lower electrode 531, a conductive filler 532, a dielectric film 533, an upper electrode 534, and a contact plug 535 may be formed on the interlayer insulating film 520 and the contact plug 522. The lower electrode 531, the conductive filler 532, the dielectric film 533, the upper electrode 534, and the contact plug 535 may be formed by the same process as the first capacitor C1, the second capacitor C2, the connector 300 and the connector 310 of FIG. 6.

An interlayer insulating film 530 may be formed to cover the interlayer insulating film 520, the lower electrode 531, the conductive filler 532, the dielectric film 533, the upper electrode 534, and the contact plug 535.

A wiring 541, a contact plug 542, a wiring 543 and an interlayer insulating film 540 may be formed on the interlayer insulating film 530 and the contact plug 535. Accordingly, the lower electrode 531, the conductive filler 532, the dielectric film 533, the upper electrode 534, and the contact plug 535, which function as connectors, may electrically connect the wiring 541 and the wiring 521.

The wiring 543 and the wiring 472 may be connected to each other on a surface on which they are in contact with each other. That is, the wiring 543 and the wiring 472 may be electrically connected to each other. As a result, the gate electrode 430 and the gate electrode 432 may be electrically connected to the gate electrode 511. The pixel PX5 may correspond to an embodiment in which a light-receiving region and a circuit region are stacked.

Hereinafter, a pixel array region PA of an image sensor 1100 according to some other example embodiments will be explained referring to FIGS. 24 and 25.

Figure 24:
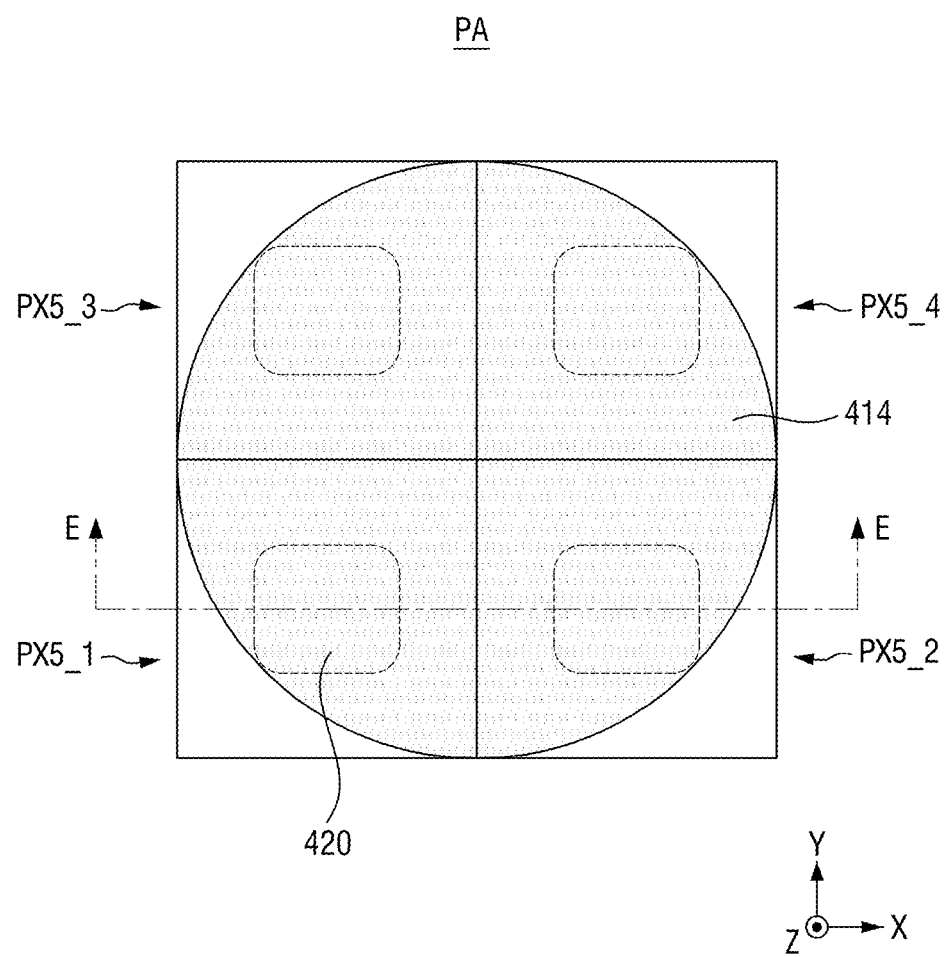
FIG. 24 is a diagram showing a pixel array region of an image sensor according to some example embodiments.

FIG. 24 is a diagram showing a pixel array region of an image sensor according to some example embodiments. FIG. 25 is a cross-sectional view of the pixel array region taken along E-E of FIG. 24. For convenience of explanation, overlapping parts with those of example embodiments described with reference to FIGS. 1 to 12 and 23 will be briefly described or omitted.

Referring to FIG. 24, the pixel array region PA may include a plurality of pixels. For example, the pixel array region PA may include a pixel PX5_1, a pixel PX5_2, a pixel PX5_3, and a pixel PX5_4. Each pixel may include a first dopant injection region 420. That is, each pixel may include a photoelectric conversion element (or a photoelectric converter) different from each other.

A microlens 414 may cover all of the pixel PX5_1, the pixel PX5_2, the pixel PX5_3, and the pixel PX5_4. For example, the pixel PX5_1, the pixel PX5_2, the pixel PX5_3, and the pixel PX5_4 are regularly arranged, and the microlens 414 may entirely cover the pixel PX5_1, the pixel PX5_2, the pixel PX5_3, and the pixel PX5_4. In this case, the pixel array region PA may be a Q-cell.

Figure 25:
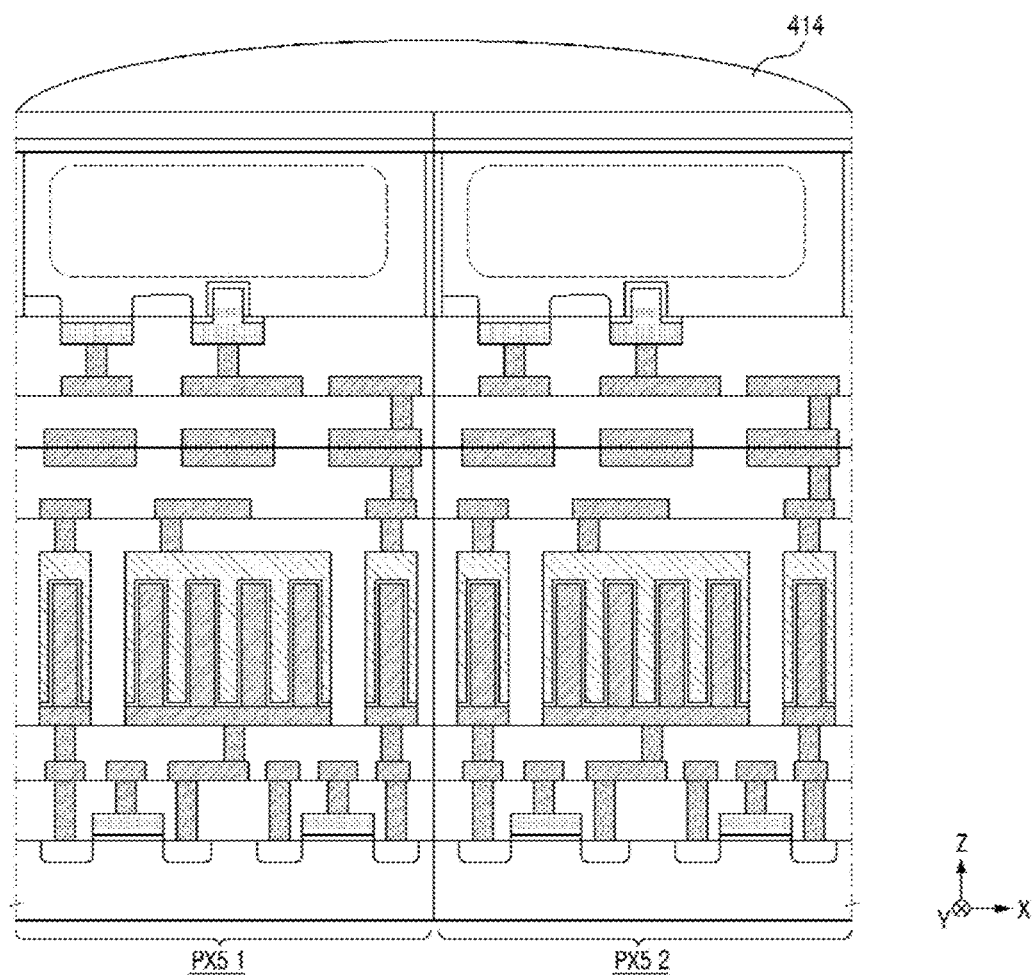
FIG. 25 is a cross-sectional view of a pixel array region taken along E-E of FIG. 24.

Referring to FIG. 25, the pixel PX5_1 and the pixel PX5_2 may be placed adjacent to each other. Here, at least one of the pixel PX5_1 and the pixel PX5_2 may be the same as the pixel PX5 explained referring to FIG. 23. However, the embodiment according to the disclosure is not limited thereto, and at least one of the pixel PX5_1 and the pixel PX5_2 may be the same as the pixel PX1 explained using FIG. 6.

The microlens 414 may entirely cover the pixel PX5_1 and the pixel PX5_2. That is, light which is incident by penetrating the microlens 414 may be incident on the photoelectric conversion elements of the pixel PX5_1 and the pixel PX5_2.

Those skilled in the art will appreciate that many variations and modifications may be made to the example embodiments without substantially departing from the principles of the disclosure. Therefore, the example embodiments of the disclosure are used in a generic and descriptive sense only and not for purposes of limitation.

What is claimed is:
1. An image sensor comprising:
   a substrate including a first surface and a second surface on which light is incident, the second surface being opposite to the first surface;
   a photoelectric converter provided in the substrate;
   a first metal layer provided on the first surface of the substrate;
   a second metal layer provided on the first metal layer; and
   a capacitor layer provided between the first metal layer and the second metal layer,
   wherein the capacitor layer includes:
      a first lower electrode electrically connected to the first metal layer,
      a second lower electrode spaced apart from the first lower electrode and electrically conned to the first metal layer,
      a first upper electrode electrically connected to the second metal layer,
      a second upper electrode spaced apart from the first upper electrode and electrically connected to the second metal layer,
      a third upper electrode spaced apart from the first and second upper electrodes and electrically connected to the second metal layer,
      a first capacitor provided between the first lower electrode and the first upper electrode,
      a second capacitor provided between the second lower electrode and the second upper electrode,
   a third capacitor provided only between the second lower electrode and the third upper electrode, and
   an insulation film provided between the second capacitor and the third capacitor.
2. The image sensor of claim 1, further comprising:
   a transistor provided in the substrate and adjacent to the photoelectric converter,
   wherein the first metal layer includes a first wiring, and
   wherein the first wiring is electrically connected to the transistor, and the first lower electrode is electrically connected to the first wiring.
3. The image sensor of claim 2, wherein the second metal layer includes a second wiring and a third wiring spaced apart from the second wiring, and
   wherein the first upper electrode is electrically connected to the second wiring, and the second upper electrode is electrically connected to the third wiring.
4. The image sensor of claim 1, wherein an upper surface of the first upper electrode is located substantially on a same surface as an upper surface of the second upper electrode.
5. The image sensor of claim 1, wherein a thickness of the first capacitor measured from the first lower electrode and a thickness of the second capacitor measured from the first lower electrode are substantially the same.
6. The image sensor of claim 1, wherein the first capacitor and the second capacitor are spaced apart from each other.
7. The image sensor of claim 1, further comprising:
   a first contact plug provided between the first upper electrode and the second metal layer; and
   a second contact plug provided between the second upper electrode and the second metal layer.
8. The image sensor of claim 7, wherein the first metal layer and the second metal layer are electrically connected via the first lower electrode, the second capacitor, the second upper electrode, and the second contact plug.

9. The image sensor of claim 8, wherein the first metal layer and the second metal layer are electrically connected via the first lower electrode, the first capacitor, the first upper electrode, and the first contact plug.

10. The image sensor of claim 7, further comprising:
a third contact plug electrically connected to the first lower electrode and the second metal layer,
wherein a length of the third contact plug is greater than a length of the second contact plug.

11. An image sensor comprising:
a first layer;
a photoelectric converter in the first layer;
a first transistor provided in the first layer and adjacent to the photoelectric converter;
a second transistor provided in the first layer and electrically connected to the first transistor;
a second layer provided on the first layer and including a first surface facing the first layer and a second surface opposite to the first surface;
a first lower wiring electrically connected to the first transistor, the first lower wiring being provided on the first surface;
a second lower wiring electrically connected to the second transistor, the second lower wiring being provided on the first surface;
a first upper wiring provided on the second surface;
a second upper wiring spaced apart from the first upper wiring and provided on the second surface;
a third upper wiring spaced apart from the first and second upper wirings and provided on the second surface;
a capacitor structure electrically connected to the first upper wiring and the first lower wiring, the capacitor structure including a first capacitor; and
a first connector electrically connected to the second upper wiring and the second lower wiring, the first connector including a second capacitor, the first connector provided only between the second upper wiring and the second lower wiring,
a second connector electrically connected to the third upper wiring and the first lower wiring, the second connector including a third capacitor; and
an insulating film provided between the second capacitor and the third capacitor.

12. The image sensor of claim 11, wherein the second lower wiring is electrically connected to a gate electrode of the second transistor.

13. The image sensor of claim 12, wherein the second transistor is turned on or off by a signal transmitted to the second transistor through the first connector.

14. The image sensor of claim 11, wherein an upper surface of the capacitor structure is located substantially on a same surface as an upper surface of the first connector.

15. The image sensor of claim 11, wherein the capacitor structure and the first connector are spaced apart from each other.

16. The image sensor of claim 11, wherein the capacitor structure includes a first contact plug electrically connected to the first capacitor and the first upper wiring, and
wherein the first connector includes a second contact plug electrically connected to the second capacitor and the second upper wiring.

17. The image sensor of claim 16, wherein a length of the first contact plug and a length of the second contact plug are substantially the same.

18. The image sensor of claim 16, further comprising:
a third lower wiring provided on the first surface;
a fourth upper wiring provided on the second surface; and
a third contact plug electrically connected to the fourth upper wiring and the third lower wiring.

19. The image sensor of claim 18, wherein a length of the third contact plug is greater than a length of the second contact plug.

20. An image sensor comprising:
a first layer including a first surface and a second surface on which light is incident, the second surface being opposite to the first surface;
a photoelectric converter provided in the first layer;
a first transistor provided in the first layer and adjacent to the photoelectric converter;
a second transistor provided in the first layer and electrically connected to the first transistor;
a second layer provided on the first surface, the second layer including a third surface facing the first surface and a fourth surface opposite to the third surface;
a first lower wiring electrically connected to the first transistor, the first lower wiring being disposed on the third surface;
a second lower wiring electrically connected to the second transistor, the second lower wiring being provided on the third surface;
a first upper wiring, a second upper wiring, and a third upper wiring that are provided on the fourth surface;
a first lower electrode electrically connected to the first lower wiring;
a second lower electrode electrically connected to the second lower wiring;
a first upper electrode electrically connected to the first upper wiring through a first contact plug;
a second upper electrode electrically connected to the second upper wiring through a second contact plug;
a third upper electrode electrically connected to the third upper wiring through a third contact plug;
a first capacitor provided between the first lower electrode and the first upper electrode;
a second capacitor provided between the first lower electrode and the second upper electrode;
a third capacitor provided only between the second lower electrode and the third upper electrode; and
an insulation film provided between the second capacitor and the third capacitor.

* * * * *